US012804866B2

(12) United States Patent
Yang et al.

(10) Patent No.: US 12,804,866 B2
(45) Date of Patent: Nov. 17, 2026

(54) DISPLAY MODULE AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Wucheng Yang, Beijing (CN); Hengzhen Liang, Beijing (CN); Xin Wang, Beijing (CN); Qianlin Pu, Beijing (CN); Chenghong Yang, Beijing (CN); Sijia Wen, Beijing (CN); Fan Li, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 120 days.

(21) Appl. No.: 18/834,108

(22) PCT Filed: Aug. 23, 2023

(86) PCT No.: PCT/CN2023/114447
§ 371 (c)(1),
(2) Date: Jul. 29, 2024

(87) PCT Pub. No.: WO2024/041571
PCT Pub. Date: Feb. 29, 2024

(65) Prior Publication Data
US 2025/0126764 A1 Apr. 17, 2025

(30) Foreign Application Priority Data
Aug. 24, 2022 (CN) ........................ 202211021607.9

(51) Int. Cl.
*G06F 1/16* (2006.01)
*H05K 1/189* (2026.01)
(Continued)

(52) U.S. Cl.
CPC ......... *H05K 7/20963* (2013.01); *H05K 1/189* (2013.01); *H05K 2201/10128* (2013.01)

(58) Field of Classification Search
CPC ........................... H05K 7/20963; H05K 1/189
See application file for complete search history.

(56) References Cited

U.S. PATENT DOCUMENTS 10,863,654 B1 * 12/2020 Zhang ................ H05K 7/20963
10,905,009 B2 * 1/2021 Choi ........................ H05K 5/03
(Continued)

FOREIGN PATENT DOCUMENTS

CN 202857136 U 4/2013
CN 207474565 U 6/2018
(Continued)

*Primary Examiner* — Anthony M Haughton
(74) *Attorney, Agent, or Firm* — The Webb Law Firm

(57) ABSTRACT

A display module includes a display panel, a flexible circuit board and an adhesive structure. The display panel has a light exit side and a backlight side opposite to the light exit side. The flexible circuit board includes a main body portion, a neck portion and a connection portion. The neck portion is located between the main body portion and the connection portion. An end of the main body portion away from the neck portion is connected to an edge of the display panel. The connection portion, the neck portion and at least part of the main body portion are located on the backlight side of the display panel. The adhesive structure is located between the main body portion and the display panel, and at least part of the adhesive structure is located in an edge area of the main body portion proximate to the neck portion.

20 Claims, 19 Drawing Sheets

(51) Int. Cl.

| | |
|---|---|
| ***H05K 5/00*** | (2025.01) |
| ***H05K 7/00*** | (2006.01) |
| ***H05K 7/20*** | (2006.01) |

(56) References Cited

U.S. PATENT DOCUMENTS

| | | | | |
|---|---|---|---|---|
| 11,563,189 | B2 * | 1/2023 | Park | H10K 59/40 |
| 11,812,558 | B2 * | 11/2023 | Li | H05K 9/0054 |
| 11,882,649 | B2 * | 1/2024 | Lee | H05K 1/0259 |
| 2010/0108370 | A1 * | 5/2010 | Kapusta | H05K 1/181<br>29/832 |
| 2019/0006444 | A1 * | 1/2019 | Nishimura | H04M 1/0269 |
| 2019/0380197 | A1 * | 12/2019 | Lee | H05K 1/028 |
| 2020/0022261 | A1 * | 1/2020 | Choi | H05K 7/20963 |
| 2021/0280806 | A1 * | 9/2021 | Park | B32B 27/281 |
| 2022/0007513 | A1 * | 1/2022 | Li | G09F 9/00 |
| 2022/0059430 | A1 * | 2/2022 | Ham | H01L 25/18 |

FOREIGN PATENT DOCUMENTS

| | | | |
|---|---|---|---|
| CN | 108251007 | A | 7/2018 |
| CN | 109493748 | A | 3/2019 |
| CN | 111326071 | A | 6/2020 |
| CN | 211699567 | U | 10/2020 |
| CN | 112585760 | A | 3/2021 |
| CN | 112771598 | A | 5/2021 |
| CN | 215345216 | U | 12/2021 |
| CN | 114144038 | A | 3/2022 |
| CN | 114241905 | A | 3/2022 |
| CN | 217112946 | U | 8/2022 |
| CN | 115620638 | A | 1/2023 |

* cited by examiner

DISPLAY MODULE AND DISPLAY APPARATUS

CROSS-REFERENCE TO RELATED APPLICATIONS

This application is the United States national phase of International Patent Application No. PCT/CN2023/114447, filed Aug. 23, 2023, and claims priority to Chinese Patent Application No. 202211021607.9, filed Aug. 24, 2022, the disclosures of which are hereby incorporated by reference in their entireties.

BACKGROUND OF THE INVENTION

Field of the Invention

The present disclosure relates to the field of display technologies, and in particular, to a display module and a display apparatus.

Description of Related Art

With the continuous development of science and technology, more and more display apparatuses are widely used in daily life and work of people, bring great convenience to the daily life and work of people, and become an indispensable and important tool for people today.

SUMMARY OF THE INVENTION

In an aspect, a display module is provided. The display module includes a display panel, a flexible circuit board and an adhesive structure. The display panel has a light exit side and a backlight side opposite to the light exit side. The display panel includes a protective cover plate, a display substrate and a heat dissipation film. The display substrate is located between the protective cover plate and the heat dissipation film, and the protective cover plate is located on a side of the display substrate facing the light exit side. The heat dissipation film includes an adhesive layer, at least one buffer layer and at least one heat dissipation layer. The at least one buffer layer is located between the adhesive layer and the at least one heat dissipation layer, and the adhesive layer is located on a side of the at least one buffer layer proximate to the protective cover plate. The flexible circuit board includes a main body portion, a neck portion and a connection portion. The neck portion is located between the main body portion and the connection portion, and an end of the main body portion away from the neck portion is connected to an edge of the display panel. The connection portion, the neck portion and at least part of the main body portion are located on the backlight side of the display panel. The adhesive structure is located between the main body portion and the at least one heat dissipation layer. At least part of the adhesive structure is located in an edge area of the main body portion proximate to the neck portion.

In some embodiments, the adhesive structure includes a first adhesive structure. The first adhesive structure includes a first portion, and the first portion is located in the edge area of the main body portion proximate to the neck portion. An extension direction of the neck portion is a first direction. A ratio of a dimension of the first portion in the first direction to a dimension of the main body portion in the first direction is greater than or equal to 10% and less than or equal to 50%.

In some embodiments, a direction parallel to a display surface of the display panel and perpendicular to the first direction is a second direction. At least one end of the first portion in the second direction extends beyond the neck portion.

In some embodiments, a dimension of the first portion in the second direction is greater than a dimension of the neck portion in the first direction.

In some embodiments, two ends of the first portion in the first direction are substantially flush with two ends of the edge area of the main body portion proximate to the neck portion in the first direction.

In some embodiments, the first adhesive structure further includes a second portion. The second portion is located on a side of the first portion away from the neck portion, and the second portion is connected to the first portion. A ratio of a sum of dimensions of the first portion and the second portion in the first direction to the dimension of the main body portion in the first direction is greater than or equal to 50% and less than or equal to 90%. Alternatively, the ratio of the sum of the dimensions of the first portion and the second portion in the first direction to the dimension of the main body portion in the first direction is equal to 100%.

In some embodiments, an orthographic projection of both the first portion and the second portion on a display surface of the display panel overlaps with an orthographic projection of the main body portion on the display surface of the display panel.

In some embodiments, the first adhesive structure further includes a third portion. The third portion and the first portion are connected to constitute a frame-shaped structure by enclosing extending along an edge of the main body portion.

In some embodiments, the adhesive structure further includes a second adhesive structure. The second adhesive structure is located inside the frame-shaped structure, and the second adhesive structure and the frame-shaped structure are spaced apart.

In some embodiments, the adhesive structure further includes a third adhesive structure. The third adhesive structure is located on a side of the first portion away from the neck portion, and the third adhesive structure and the first portion are spaced apart.

In some embodiments, the third adhesive structure includes a plurality of fourth portions, and the plurality of fourth portions are arranged at intervals in the first direction.

In some embodiments, the main body portion includes a first side edge proximate to the neck portion. The first side edge includes a first line segment, a second line segment and a third line segment. The second line segment is connected to the neck portion, and the first line segment and the third line segment are located on both sides of the second line segment. An extension direction of the neck portion is a first direction. A direction parallel to a display surface of the display panel and perpendicular to the first direction is a second direction. At least one of the first line segment and the third line segment extends in the second direction, and has a length greater than or equal to 2 mm.

In some embodiments, the first line segment and the third line segment both extend in the second direction. The first side edge further includes a fourth line segment. The fourth line segment is connected between the first line segment and the second line segment, and a middle portion of the fourth line segment protrudes toward a second side edge. The second side edge is an edge of the main body portion opposite to the first side edge. The fourth line segment defines a groove structure, and a dimension of the groove structure in the second direction is greater than or equal to a dimension of the groove structure in the first direction.

In some embodiments, the second line segment extends in the second direction. An included angle between the first line segment and a side edge of the neck portion extending in the first direction is an obtuse angle.

In some embodiments, the neck portion includes a transition portion proximate to the main body portion. The transition portion includes a mesh structure.

In some embodiments, the transition portion includes a first transition portion and a second transition portion. The first transition portion is closer to the main body portion than the second transition portion. A width of the first transition portion gradually decreases in a first direction. The first direction is an extension direction of the neck portion.

In some embodiments, the at least one buffer layer includes a first buffer layer and a second buffer layer; the first buffer layer is located between the adhesive layer and the second buffer layer; and an elastic modulus of the second buffer layer is greater than an elastic modulus of the first buffer layer. And/or, the at least one heat dissipation layer includes a first heat dissipation layer and a second heat dissipation layer, and the second heat dissipation layer is located on a side of the first heat dissipation layer away from the adhesive layer.

In some embodiments, the display module further includes a shielding film. The shielding film is located on a side of the main body portion away from the display panel. An orthographic projection of the shielding film on a display surface of the display panel covers an orthographic projection of the main body portion on the display surface of the display panel. At least one edge of the orthographic projection of the shielding film on the display surface of the display panel is located outside the orthographic projection of the main body portion on the display surface of the display panel.

In some embodiments, the orthographic projection of the shielding film on the display surface of the display panel includes a first edge proximate to the neck portion. The first edge is located outside the orthographic projection of the main body portion on the display surface of the display panel.

In some embodiments, the orthographic projection of the shielding film on the display surface of the display panel includes a second edge. The second edge and the first edge are connected and have an obtuse angle therebetween. The second edge is located outside the orthographic projection of the main body portion on the display surface of the display panel.

In some embodiments, the shielding film includes a first insulating layer, a shielding layer and a second insulating layer. The shielding layer is located between the first insulating layer and the second insulating layer, and the first insulating layer is closer to the main body portion than the shielding layer. A thickness of the second insulating layer is greater than or equal to a thickness of the first insulating layer.

In some embodiments, the display module further includes a driver chip. The driver chip is located on the backlight side of the display panel, and the driver chip is used to drive the display panel. The first insulating layer includes a first via hole, and the driver chip is in contact with the shielding layer through the first via hole. In a direction parallel to the display surface of the display panel, a portion of the shielding layer protrudes from the main body portion and the first insulating layer to be in contact with the heat dissipation film.

In some embodiments, the display module further includes a thermally conductive structure. The thermally conductive structure includes a first thermally conductive structure and a second thermally conductive structure. The driver chip is in contact with the shielding layer through the first thermally conductive structure, and the shielding layer is in contact with the heat dissipation film through the second thermally conductive structure.

In another aspect, a display apparatus is provided. The display apparatus includes the display module as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DESCRIPTION OF THE INVENTION

Figure 1:
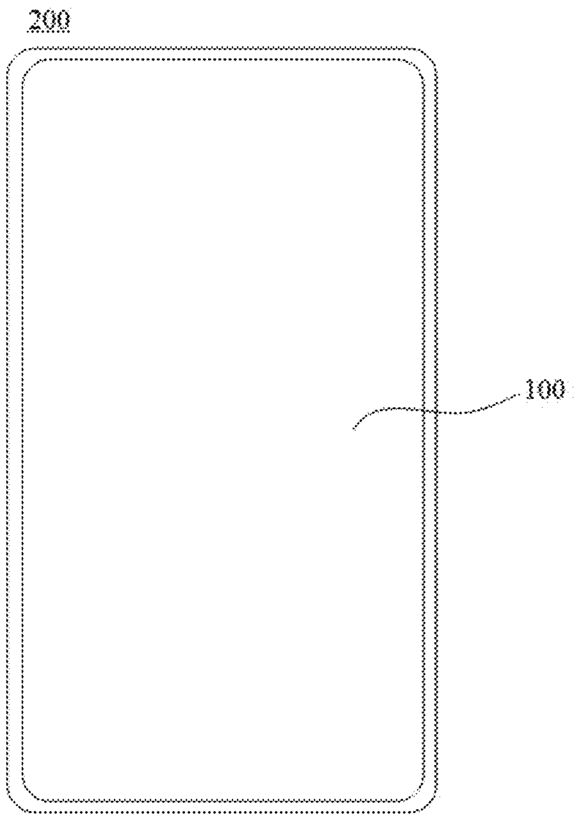
FIG. 1 is a structural diagram of a display apparatus, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of" or "the plurality of" means two or more unless otherwise specified.

In the description of some embodiments, the expressions "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "applicable to" as used herein indicates an open and inclusive expression, which does not exclude apparatuses that are applicable to or configured to perform additional tasks or steps.

In addition, the use of the phrase "based on" is meant to be open and inclusive, since a process, step, calculation or other action that is "based on" one or more of the stated conditions or values may, in practice, be based on additional conditions or values exceeding those stated.

The term "about", "substantially" or "approximately" as used herein includes a stated value and an average value within an acceptable range of deviation of a particular value. The acceptable range of deviation is determined by a person of ordinary skill in the art in consideration of the measurement in question and errors associated with the measurement of a particular quantity (i.e., limitations of the measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art in view of measurement in question and errors associated with the measurement of a particular quantity (i.e., limitations of the measurement system). For example, the term "parallel" includes absolute parallelism and approximate parallelism, and an acceptable range of deviation of the approximate parallelism may be a deviation within 5°; the term "perpendicular" includes absolute perpendicularity and approximate perpendicularity, and an acceptable range of deviation of the approximate perpendicularity may also be a deviation within 5°; and the term "equal" includes absolute equality and approximate equality, and an acceptable range of deviation of the approximate equality may be a difference between two equals being less than or equal to any of 30%, 20%, 10% or 5% of either of the two equals.

It will be understood that when a layer or element is referred to as being on another layer or substrate, the layer or element may be directly on the another layer or substrate, or there may be intermediate layer(s) between the layer or element and the another layer or substrate.

Exemplary embodiments are described herein with reference to sectional views and/or plan views as idealized exemplary drawings. In the accompanying drawings, thicknesses of layers and sizes of areas are enlarged for clarity. Variations in shapes relative to the accompanying drawings due to, for example, manufacturing technologies and/or tolerances may be envisaged. Therefore, the exemplary embodiments should not be construed to be limited to the shapes of areas shown herein, but to include deviations in the shapes due to, for example, manufacturing. For example, an etched area shown in a rectangular shape generally has a feature of being curved. Therefore, the areas shown in the accompanying drawings are schematic in nature, and their shapes are not intended to show actual shapes of the areas in an apparatus, and are not intended to limit the scope of the exemplary embodiments.

FIG. 1 is a structural diagram of a display apparatus in accordance with some embodiments.

As shown in FIG. 1, some embodiments of the present disclosure provide a display apparatus 200. The display apparatus 200 includes a display module 100.

For example, the display apparatus 200 further includes a frame, a display driver integrated circuit (IC), and other electronic components.

For example, the display apparatus 200 may be an electroluminescent display apparatus or a photoluminescent display apparatus. The display apparatus may be a liquid crystal display (LCD); alternatively, the display apparatus may be an electroluminescent display apparatus or a photoluminescent display apparatus. In a case where the display apparatus is the electroluminescent display apparatus, the electroluminescent display apparatus may be an organic light-emitting diode (OLED) display apparatus or a quantum dot light-emitting diode (QLED) display apparatus. In a case where the display apparatus is the photoluminescent display apparatus, the photoluminescent display apparatus may be a quantum dot photoluminescent display apparatus. The display apparatus may alternatively be a mini light-emitting diode (mini LED) display apparatus and a micro light-emitting diode (micro LED) display apparatus.

In a case where the display apparatus 200 is a liquid crystal display, in some embodiments, the display apparatus 200 includes a cover glass, a display panel 10, and a backlight module. The backlight module is used to provide a light source for the display panel, so that the display panel 10 may display images. In some examples, the backlight module in the display apparatus 200 may include optical films, and the optical films are located on a side of the light source in the backlight module proximate to the display panel 10. The optical films may include reflective sheets, diffusion plates, brightness-enhancing films (prism sheets), diffusion sheets, and the like, and may be used to improve brightness and uniformity of light.

In a case where the display apparatus 200 is an OLED display apparatus, a QLED display apparatus, a mini LED display apparatus, or a micro LED display apparatus, in some embodiments, the display panel in the display apparatus 200 includes a light-emitting substrate, and the light-emitting substrate may realize image display.

For example, the display apparatus 200 may be any apparatus that displays images whether in motion (e.g., videos) or stationary (e.g., static images), and regardless of text or image. More specifically, it is expected that the display apparatus in the embodiments may be implemented in or associated with a variety of electronic devices. The variety of electronic devices may include (but are not limit to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (such as odometer displays), navigators, cockpit controllers and/or displays, camera view displays (such as rear view camera displays in vehicles), electronic photos, electronic billboards or signs, projectors, architectural structures, packaging and aesthetic structures (such as displays for displaying an image of a piece of jewelry), etc.

The following will be described by taking an example of the OLED display apparatus.

Figure 2A:
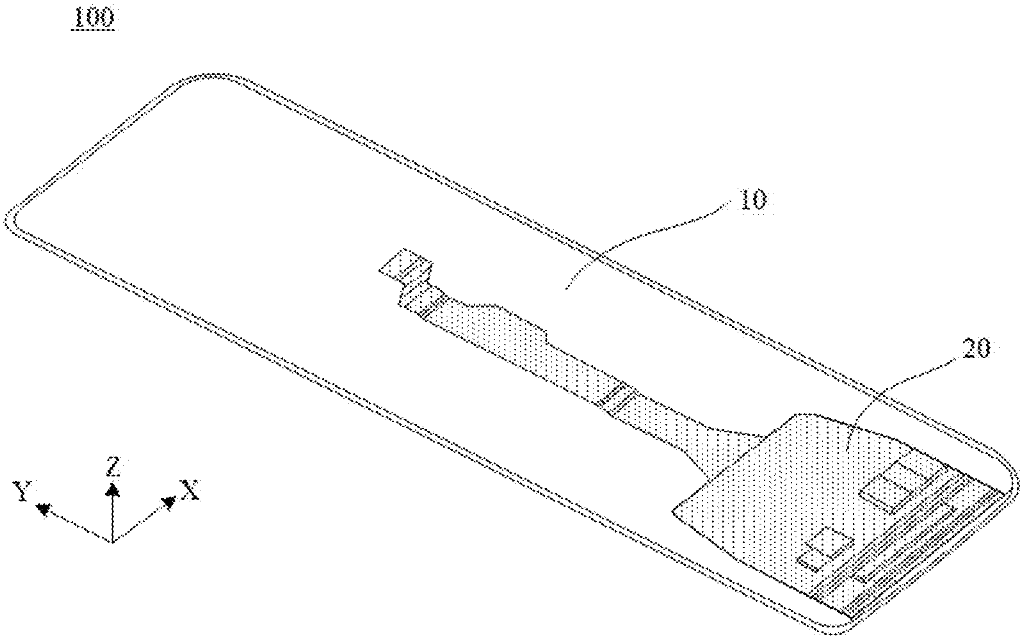
FIG. 2A is a structural diagram of a display module, in accordance with some embodiments.
Figure 2B:
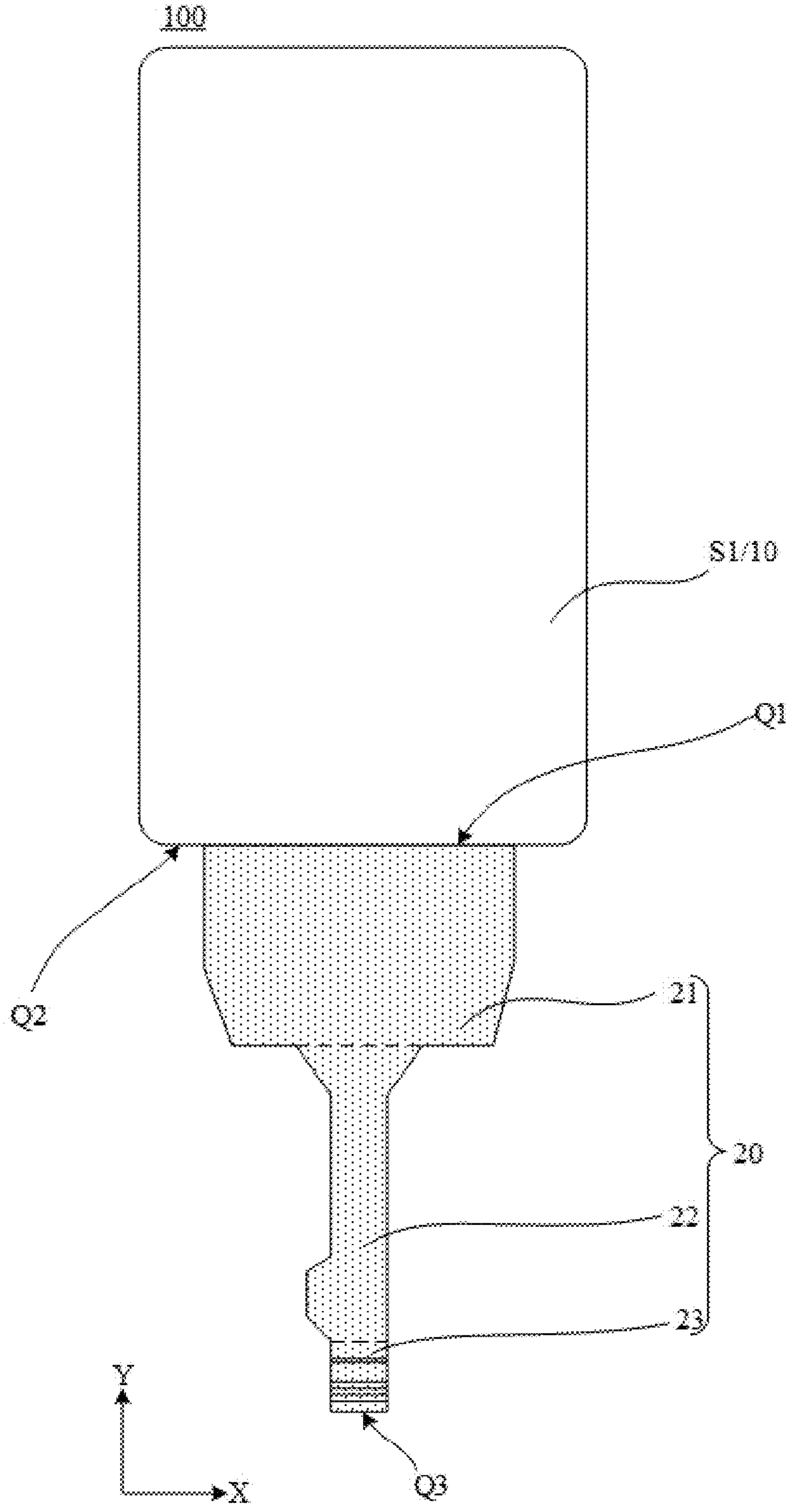
FIG. 2B is a structural diagram of a light exit side of a display module, in accordance with some embodiments.
Figure 2C:
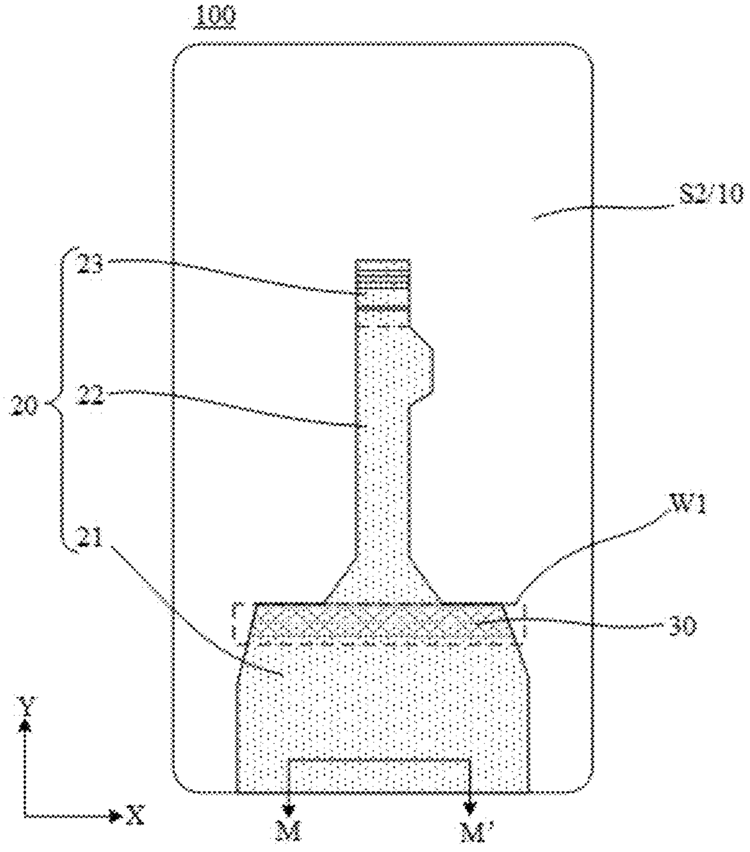
FIG. 2C is a structural diagram of a backlight side of a display module, in accordance with some embodiments.
Figure 2D:
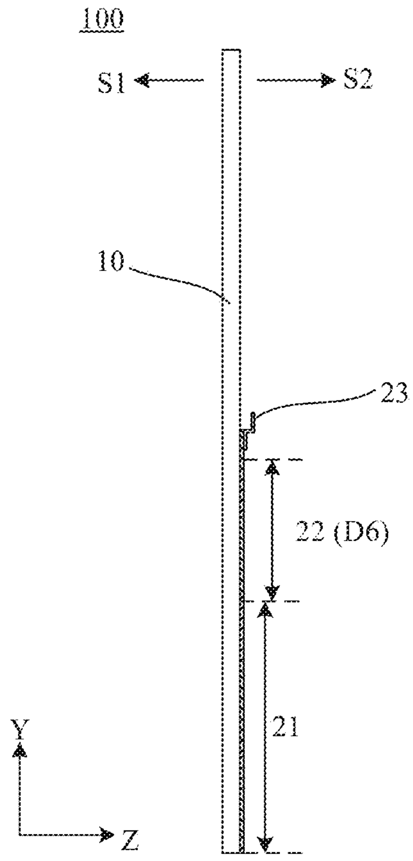
FIG. 2D is a structural diagram of a display module in a thickness thereof, in accordance with some embodiments.

FIG. 2A is a structural diagram of a display module in accordance with some embodiments. FIG. 2B is a structural diagram of a light exit side of a display module in accordance with some embodiments. FIG. 2C is a structural diagram of a backlight side of a display module in accordance with some embodiments. FIG. 2D is a structural diagram of a display module in a thickness thereof in accordance with some embodiments. Among them, a flexible circuit board 20 in the display module 100 shown in FIG. 2B is not bent to a backlight side S2 of the display panel 10, and the flexible circuit board 20 in the display module 100 shown in each of FIGS. 2A, 2C and 2D is bent to the backlight side S2 of the display panel 10.

As shown in FIGS. 2A to 2D, some embodiments of the present disclosure provide a display module 100. The display module 100 includes a display panel 10 and a flexible circuit board 20.

The display panel 10 may be an OLED display panel. The type of the display panel 10 is not limited in embodiments of the present disclosure, and may be provided according to actual needs.

For example, as shown in FIG. 2D, the display panel 10 has a light exit side S1 and a backlight side S2 opposite to the light exit side S1. The light exit side S1 and the backlight side S2 are opposite to each other in a third direction Z, and the third direction Z is a thickness direction of the display panel 10. It can be understood that the light exit side S1 may be a side of the display panel 10 where the display panel 10 performs display and emits light. The backlight side S2 may be a side of the display panel 10 facing away from the light exit side S1. That is, the light exit side S1 is located in the front of the display panel 10, and the backlight side S2 is located in the back of the display panel 10.

Figure 2E:
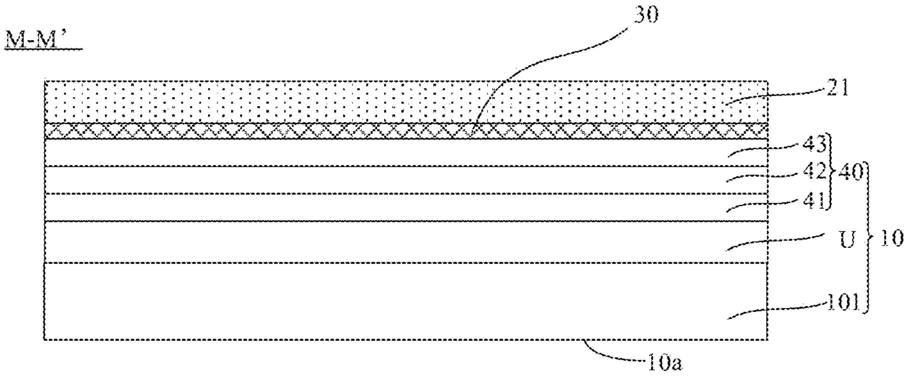
FIG. 2E is a sectional view taken along an M-M' direction in FIG. 20.

FIG. 2E is a sectional view taken along an M-M' direction in FIG. 2C.

The display panel 10 includes a protective cover plate 101, a display substrate U and a heat dissipation film 40. The display substrate U is located between the protective cover plate 101 and the heat dissipation film 40.

The protective cover plate 101 is located on a side of the display substrate U facing the light exit side S1. The protective cover plate 101 may be used to protect the display panel 10 (the display substrate U) and prevent the display panel 10 (the display substrate U) from being scratched.

For example, the protective cover plate 101 is a flexible cover plate. The material of the protective cover plate 101 includes at least one of transparent polyimide and ultra-thin glass.

The heat dissipation film 40 includes an adhesive layer 41, at least one buffer layer and at least one heat dissipation layer. The at least one buffer layer is located between the adhesive layer 41 and the at least one heat dissipation layer, and the adhesive layer 41 is located on a side of the at least one buffer layer proximate to the protective cover plate 101.

For example, the heat dissipation film 40 includes a single buffer layer and a single heat dissipation layer. The buffer layer may be a first buffer layer 42, and the heat dissipation layer may be a first heat dissipation layer 43. That is, the illustration is made by taking an example where the heat dissipation film 40 includes the adhesive layer 41, the first buffer layer 42 and the first heat dissipation layer 43.

With the above provision, the heat dissipation film 40 may play a role of heat dissipation, be conducive to rapid dissipation of heat generated when the display panel 10 works, and may also play a role of shading light.

For example, the first heat dissipation layer 43 may be connected to an adhesive structure 30, so that a main body portion 21 of the flexible circuit board 20 is fixed on a side of the first heat dissipation layer 43 away from the first buffer layer 42, that is, the main body portion 21 may be located on the backlight side S2 of the display panel 10.

In some examples, the heat dissipation film 40 may be super clean foam (SCF).

In some examples, the adhesive layer 41 may be a textured adhesive (EMBO) layer, which may be pressed by a grid to form vertical and horizontal patterns on the adhesive surface by printing, and may prevent curling caused by shrinkage of the adhesive layer and strengthen tightness of attachment between the heat dissipation film 40 and the display panel 10. In addition, the grid shape may also facilitate discharge of air during attachment, so as to prevent bubbles from being generated during attachment. For example, the material of the adhesive layer 41 is acrylic adhesive or silicone.

In some examples, a thickness of the adhesive layer 41 may be in a range of 0.03 mm to 0.2 mm, inclusive. In a case where the thickness of the adhesive layer 41 is equal to or approaches 0.03 mm, the thickness of the adhesive layer 41 is relatively small. The adhesive layer 41 may fix the heat dissipation film 40, and it is conducive to lightness and thinness of the display module 100 and it is conducive to avoidance of waste of resources. In a case where the thickness of the adhesive layer 41 is equal to or approaches 0.2 mm, the thickness of the adhesive layer 41 is relatively large. The adhesive layer 41 may avoid waste of resources and bond the heat dissipation film 40 and the display panel 10 well.

In some other embodiments, the thickness of the adhesive layer 41 is in a range of 0.05 mm to 0.15 mm, inclusive. In yet other embodiments, the thickness of the adhesive layer 41 is in a range of 0.08 mm to 0.12 mm, inclusive.

For example, the thickness of the adhesive layer 41 is 0.5 mm, 1 mm, 1.5 mm or 2 mm.

In some examples, the material of the first buffer layer 42 may be foam. The first buffer layer 42 may buffer external force and prevent damage to the display panel 10 caused by the attaching pressure during attachment of the heat dissipation film 40 and the display panel 10.

In some examples, a thickness of the first buffer layer 42 may be in a range of 0.05 mm to 0.35 mm, inclusive. In a case where the thickness of the first buffer layer 42 is equal to or approaches 0.05 mm, it may meet buffering requirements of the display module 100 for external forces and is conducive to realizing lightness and thinness of the display module 100, thereby avoiding waste of resources. In a case where the thickness of the first buffer layer 42 is equal to or approaches 0.35 mm, it may meet the demand for lightness and thinness of the display module 100 and a good buffering effect may be achieved, thereby preventing damage to the display panel 10 caused by the attaching pressure during attachment of the heat dissipation film 40 and the display panel 10.

In some examples, the material of the first heat dissipation layer 43 may be copper, aluminum, or silver, so that the heat dissipation film 40 has a good heat dissipation effect. For example, the material of the first heat dissipation layer 43 is copper.

The flexible circuit board (also called flexible printed circuit, FPC for short) 20 includes a main body portion 21, a neck portion 22 and a connection portion 23. The neck portion 22 is located between the main body portion 21 and the connection portion 23.

In some examples, as shown in FIGS. 2C and 2D, a substrate of the flexible circuit board 20 may be a flexible substrate. At least part of the flexible circuit board 20 may be bent to the backlight side S2 of the display panel 10 by utilizing flexibility of the flexible substrate. For example, the connection portion 23, the neck portion 22 and at least part of the main body portion 21 of the flexible circuit board 20 are located on the backlight side S2 of the display panel 10.

Since there are fewer electronic devices on the backlight side S2 of the display panel 10 than electronic devices on the light exit side S1 of the display panel 10, bending at least part of the flexible circuit board 20 to the backlight side S2 of the display panel 10 may not only facilitate realization of wiring layout of the flexible circuit board 20, but also reduce occupation of the frame on the light exit side S1 of the display panel 10 by the flexible circuit board 20, which is beneficial to achieving a narrow frame of the display panel 10.

For example, the material of the flexible substrate of the flexible circuit board 20 is an organic material. For example, the material of the flexible substrate is any of polyimide (PI), polycarbonate (PC), or polyvinyl chloride (PVC).

In some examples, as shown in FIG. 2B, an end Q1 of the main body portion 21 away from the neck portion 22 is connected to an edge Q2 of the display panel 10.

For example, the end of the main body portion 21 of the flexible circuit board 20 away from the neck portion 22 is pressed onto the display panel 10 by a bonding process, so as to achieve electrical connection between the flexible circuit board 20 and the display panel 10.

In some examples, as shown in FIG. 2B, an end Q3 of the connection portion 23 away from the neck portion 22 is connected to a motherboard of an entire machine.

For example, the connection portion 23 is a board-to-board (BTB) connector. For example, the board-to-board (BTB) connector is divided into a female connector (rece) and a male connector (plug). The two are mounted on the connection portion 23 of the flexible circuit board 20 and the entire machine, respectively, and are plugged and fitted during use to achieve electrical connection.

Therefore, the end Q1 of the main body portion 21 away from the neck portion 22 is connected to the edge Q2 of the display panel 10, and the end Q3 of the connection portion 23 away from the neck portion 22 is connected to the motherboard of the entire machine, so that the motherboard of the entire machine may be connected to the display panel 10 by the flexible circuit board 20 and used to provide driving signals for the display panel 10.

However, due to factors such as assembly of the display module 100 and lighting test of the display module 100, the flexible circuit board 20 needs to be folded inversely and pressed. Due to action of bending stress, the main body portion 21 of the flexible circuit board 20 is prone to peeling off from the backlight side S2 of the display panel 10, which causes reduction of structural stability of the display module 100 and is not conducive to subsequent operation of the display module 100.

In addition, in a case where the display panel 10 is a flexible display panel, the display panel 10 has a good flexibility. The display panel 10 (the display substrate U) includes a display portion, a bending portion, and a bonding portion, and the bending portion is located between the display portion and the bonding portion. The bonding portion may be bent to the backlight side S2 of the display panel 10 through the bending portion. In this case, the display module 100 may further include a support pad. The support pad is located on the backlight side S2 of the display panel 10. The support pad may be used to support a non-bonding portion and prevent the bending portion from being broken. The bonding portion of the display panel 10 includes the flexible circuit board 20, that is, when the bonding portion is bent to the backlight side S2 of the display panel 10, all the flexible circuit board 20 is located on the backlight side S2 of the display panel 10. Thus, the occupation of the frame on the light exit side S1 of the display panel 10 by the flexible circuit board 20 may be reduced, thereby being beneficial to achieving the narrow frame of the display panel 10.

However, when the display panel 10 and the flexible circuit board 20 are attached together, since the flexible circuit board 20 peels off from the backlight side S2 of the display panel 10, uneven stress may be caused on the backlight side S2 of the display panel 10, thus easily causing mold printing problems on the light exit side S1 of the display panel 10.

The display module 100 provided by some embodiments of the present disclosure further includes an adhesive structure 30. As shown in FIG. 20, the adhesive structure 30 is located between the main body portion 21 and the display panel 10, and at least part of the adhesive structure 30 is located in an edge area of the main body portion 21 proximate to the neck portion 22.

The adhesive structure 30 is provided between the main body portion 21 and the at least one heat dissipation layer, which may increase adhesion between the main body portion 21 and the at least one heat dissipation layer (the backlight side S2 of the display panel 10). Therefore, it may prevent the main body portion 21 of the flexible circuit board 20 from peeling off from the at least one heat dissipation layer (the backlight side S2 of the display panel 10) easily caused by inversely folding and pressing the flexible circuit board 20, thereby improving the structural stability of the display module 100. In addition, it may also prevent the light exit side S1 of the display panel 10 from being prone to molding due to uneven stress on the backlight side S2 of the display panel 10, thereby improving the quality of the display module 100.

Furthermore, in the display module 100 provided in the embodiments, at least part of the adhesive structure 30 is located in the edge area W1 of the main body portion 21 proximate to the neck portion 22.

Since when the flexible circuit board 20 is pulled up (toward a side facing away from the display panel), a junction between the main body portion 21 and the neck portion 22 of the flexible circuit board 20 is subject to great tensile stress. The adhesive structure 30 is provided in the edge area W1 of the main body portion 21 proximate to the neck portion 22, and thus the adhesion between the edge area W1 and the display panel 10 may be increased, and it may prevent a portion of the main body portion 21 proximate to the neck portion 22 from peeling off from the display panel 10 caused by warping of the portion of the main body portion 21 proximate to the neck portion 22 due to being pulled up repeatedly the edge area W1. Since a tendency of the edge area W1 to be pulled up is slowed down, other locations except the edge area W1 may also be relatively prevented from being pulled up and peeling off from the display panel 10. Therefore, the flexible circuit board 20 and the display panel 10 may be fixed rather well, and the structural stability of the display module 100 may be improved.

In some embodiments, as shown in FIG. 20, the material of the adhesive structure 30 may be colloid. In some examples, the material of the adhesive structure 30 may be an optically clear adhesive, such as one or a combination of polymethyl methacrylate (PMMA), thermoplastic polyurethane elastomer (TPU), thermoplastic elastomer (TPE) or thermoplastic polyester elastomer (TPEE), which is not limited in the embodiments of the present disclosure.

Figure 3A:
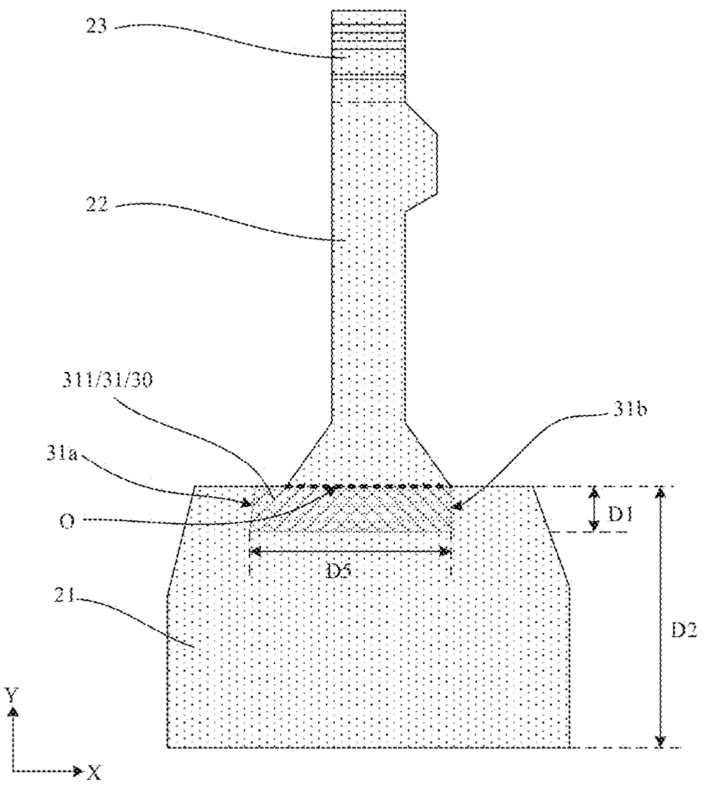
FIG. 3A is a diagram showing a connection between an adhesive structure and a flexible circuit board, in accordance with some embodiments.

FIG. 3A is a diagram showing a connection between an adhesive structure and a flexible circuit board in accordance with some embodiments.

As shown in FIG. 3A, the adhesive structure 30 in the display module 100 provided by some embodiments of the present disclosure includes a first adhesive structure 31. The first adhesive structure 31 includes a first portion 311. The first portion 311 is located in the edge area W1 of the main body portion 21 proximate to the neck portion 22. A direction in which the neck portion 22 extends is a first direction Y, and a ratio of a dimension D1 of the first portion 311 in the first direction Y to a dimension D2 of the main body portion 21 in the first direction Y is greater than or equal to 10% and less than or equal to 50%.

In a case where the ratio of the dimension D1 of the first portion 311 of the first adhesive structure 31 in the first direction Y to the dimension D2 of the main body portion 21 in the first direction Y is equal to or approaches 10%, the dimension of the first portion 311 is relatively small. Therefore, the waste of resources caused by an excessively large dimension of the first portion 311 may be avoided, and the adhesion between the main body portion 21 and the display panel 10 may be ensured, thereby preventing the main body portion 21 from peeling off from the display panel 10. In a case where the ratio of the dimension D1 of the first portion 311 of the first adhesive structure 31 in the first direction Y to the dimension D2 of the main body portion 21 in the first direction Y is equal to or approaches 50%, the dimension of the first portion 311 is relatively large. Therefore, the adhesion between the main body portion 21 and the display panel 10 may further be improved, thereby preventing the main body portion 21 from peeling off from the display panel 10 caused by warping of the main body portion 21, and the waste of resources caused by an excessively large dimension of the first portion 311 (e.g., a case where the ratio is greater than 50%) may also be avoided.

In some examples, the extending direction of the neck portion 22 is the first direction Y, and the ratio of the dimension D1 of the first portion 311 in the first direction Y to the dimension D2 of the main body portion 21 in the first direction Y is greater than or equal to 9% and less than or equal to 30%.

In a case the ratio of the dimension D1 of the first portion 311 of the first adhesive structure 31 in the first direction Y to the dimension D2 of the main body portion 21 in the first direction Y is equal to or approaches 9%, the dimension of the first portion 311 is relatively small. Therefore, the waste of resources caused by an excessively large dimension of the first portion 311 may be avoided, and the demand for adhesion between the main body portion 21 and the display panel 10 may be ensured. In a case the ratio of the dimension D1 of the first portion 311 of the first adhesive structure 31 in the first direction Y to the dimension D2 of the main body portion 21 in the first direction Y is equal to or approaches 30%, the dimension of the first portion 311 is slightly large. Therefore, the adhesion between the main body portion 21 and the display panel 10 may be improved, and the waste of resources caused by an excessively large dimension of the first portion 311 may be avoided.

In some examples, the extending direction of the neck portion 22 is the first direction Y, and the ratio of the dimension D1 of the first portion 311 in the first direction Y to the dimension D2 of the main body portion 21 in the first direction Y is greater than or equal to 8% and less than or equal to 15%.

In a case the ratio of the dimension D1 of the first portion 311 of the first adhesive structure 31 in the first direction Y to the dimension D2 of the main body portion 21 in the first direction Y is equal to or approaches 8%, the dimension of the first portion 311 is rather small. Therefore, the waste of resources caused by an excessively large dimension of the first portion 311 may be avoided, and the demand for adhesion between the main body portion 21 and the display panel 10 may be ensured. In a case the ratio of the dimension D1 of the first portion 311 of the first adhesive structure 31 in the first direction Y to the dimension D2 of the main body portion 21 in the first direction Y is equal to or approaches 15%, the dimension of the first portion 311 is slightly large. Therefore, the adhesion between the main body portion 21 and the display panel 10 may be improved, and the waste of resources caused by an excessively large dimension of the first portion 311 may be avoided.

For example, the extension direction of the neck portion 22 is the first direction Y, and the ratio of the dimension D1 of the first portion 311 in the first direction Y to the dimension D2 of the main body portion 21 in the first direction Y is equal to 10%, 20%, 30%, 40% or 50%.

In some embodiments, the dimension D2 of the main body portion 21 in the first direction Y is in a range of 50 mm to 250 mm, inclusive. For example, the dimension D2 of the main body portion 21 in the first direction Y is 50 mm. Based on this, the dimension D1 of the first portion 311 in the first direction Y may be set greater than or equal to 5 mm.

In a case where the dimension D1 of the first portion 311 in the first direction Y is equal to or approaches 5 mm, the dimension of the first portion 311 is relatively small. Therefore, the waste of resources caused by an excessively large dimension of the first portion 311 may be avoided, the adhesion between the main body portion 21 and the display panel 10 may be ensured, thereby preventing the main body portion 21 from peeling off from the display panel 10.

In some examples, the dimension D1 of the first portion 311 in the first direction Y is greater than or equal to 10 mm.

In a case where the dimension D1 of the first portion 311 in the first direction Y is equal to or approaches 10 mm, the dimension of the first portion 311 is slightly small. Therefore, the adhesion between the main body portion 21 and the display panel 10 may be improved slightly, and the waste of resources caused by an excessively large dimension of the first portion 311 may be avoided.

In some examples, the dimension D1 of the first portion 311 in the first direction Y is greater than or equal to 20 mm.

In a case where the dimension D1 of the first portion 311 in the first direction Y is equal to or approaches 20 mm, the dimension of the first portion 311 may be slightly large. Therefore, the adhesion between the main body portion 21 and the display panel 10 may be improved well, and the waste of resources caused by an excessively large dimension of the first portion 311 may be prevented to a certain extent.

In some examples, based on the above limitation on the dimension D1 of the first portion 311 in the first direction Y, the dimension D1 of the first portion 311 in the first direction Y may be less than or equal to the dimension D2 of the main body portion 21 in the first direction Y. Thus, it may prevent the quality of the first bonding structure 31 from being affected due to being prone to absorption of air impurities when the first adhesive structure 31 overflows the main body portion 21 and is exposed to air. In addition, it may also prevent assembly of the display module 100 from being affected caused by the touch on the adhesive structure 30 by workers' fingers 30 during the assembly of the display module 100. Moreover, it may also avoid the awaste of resources.

In some examples, the dimension D1 of the first portion 311 in the first direction Y is 5 mm, 8 mm, 10 mm, 15 mm, 20 mm, 25 mm, or 30 mm.

Figure 3B:
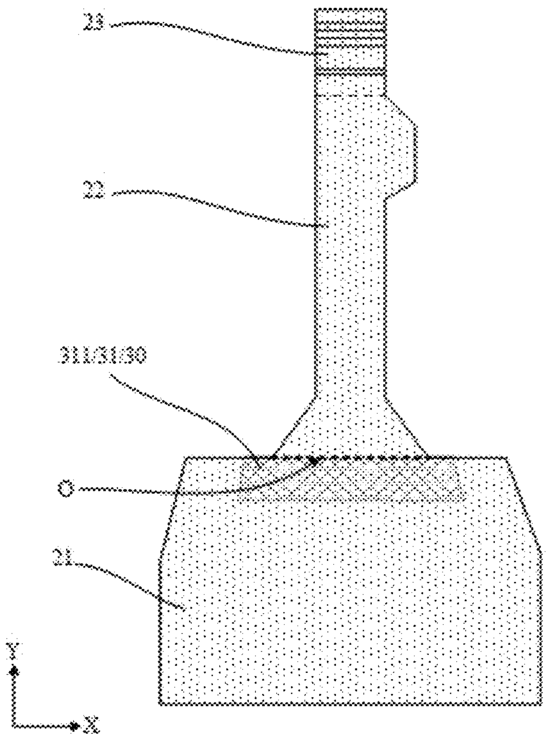
FIG. 3B is a diagram showing a connection between another adhesive structure and another flexible circuit board, in accordance with some embodiments.

FIG. 3B is a diagram showing a connection between another adhesive structure and another flexible circuit board in accordance with some embodiments.

In some embodiments, as shown in FIGS. 3A and 3B, a direction parallel to a display surface of the display panel 10 and perpendicular to the first direction Y is a second direction X. At least one end of the first portion 311 in the second direction X extends beyond the neck portion 22.

The at least one end of the first portion 311 in the second direction X extending beyond the neck portion 22 includes the following two cases.

First, as shown in FIG. 3A, one end of the first portion 311 in the second direction X extends beyond the neck portion 22. The embodiments of the present disclosure do not specifically limit the position of the end of the first portion 311 in the second direction X beyond the neck portion 22. FIG. 3A shows an example where a first end 31*a* of the first portion 311 extends beyond the neck portion 22. It can be understood that in other embodiments, a second end 31*b* of the first portion 311 may be provided to extend beyond the neck portion 22. For example, the first end 31*a* and the second end 31*b* are provided opposite to each other in the second direction X.

An example of the first end 31*a* of the first portion 311 beyond the neck portion 22 is taken.

The first end 31*a* of the first portion 311 extends beyond the neck portion 22, and the second end 31*b* thereof is retracted no more than 50% of a width of the neck portion 22. It is equivalent to that the first end 31*a* of the first portion 311 extends beyond an intersection line O between the neck portion 22 and the main body portion 21, and the second end 31*b* thereof is retracted no more than 50% of a length of the intersection line O.

Since when the flexible circuit board 20 is pulled up (toward a side away from the display panel), the position of the intersection line O between the main body portion 21 and the neck portion 22 of the flexible circuit board 20 is subject to great tensile stress. The tensile stress extends along a direction from the neck portion 22 pointing to the main body portion 21. With the above provision, the first portion 311 at the position may be used to increase the adhesion between the main body portion 21 and the display panel 10 and resist partial tensile stress at part of the intersection line O, so as to reduce probability of the main body portion 21 being repeatedly pulled up, thereby alleviating the problem of the main body portion 21 peeling off from the display panel 10.

In some examples, the second end 31*b* is retracted no more than 80% of the width of the neck portion 22, that is, the second end 31*b* is retracted no more than 80% of the length of the intersection line O. For example, the second end 31*b* is flush with an end of the neck portion 22 away from the first end 31*a*.

With the above provision, the first portion 311 at the position may be used to improve the adhesion between the main body portion 21 and the display panel 10 well and resist partial tensile stress at the entire intersection line O, so as to well reduce the probability of the main body portion 21 being repeatedly pulled up, thereby alleviating the problem of the main body portion 21 peeling off from the display panel 10.

Second, as shown in FIG. 3B, both ends of the first portion 311 in the second direction X extend beyond the neck portion 22. It is equivalent to both ends of the first portion 311 extend beyond the intersection line O.

Since when the flexible circuit board 20 is pulled up (toward a side away from the display panel), the position of the intersection line O between the main body portion 21 and the neck portion 22 of the flexible circuit board 20 is subject to great tensile stress, and the tensile stress is also relatively great at a position near the intersection line O. The tensile stress extends along a direction from the neck portion 22 pointing to the main body portion 21. With the above provision, the first portion 311 may be used to increase the adhesion between the main body portion 21 and the display panel 10 and resist partial tensile stress at the intersection line O and near the intersection line O, so as to effectively reduce the probability of the main body portion 21 being repeatedly pulled up, thereby alleviating the problem of the main body portion 21 peeling off from the display panel 10.

In some embodiments, as shown in FIGS. 2D and 3A, a dimension D5 of the first portion 311 in the second direction X is greater than a dimension D6 of the neck portion 22 in the first direction Y.

As shown in FIG. 3A, on a basis that an end of the first portion 311 in the second direction X extends beyond the neck portion 22, the dimension of the first portion 311 in the second direction X is set greater than the dimension of the neck portion 22 in the first direction Y, so that for another end of the first portion 311 not extending beyond the neck portion 22, the first portion 311 is retracted not exceeding 50% of the width of the neck portion 22.

Therefore, the first portion 311 may be used to increase the adhesion between the main body portion 21 and the display panel 10 and resist partial tensile stress at the intersection line O, so as to effectively reduce the probability of the main body portion 21 being repeatedly pulled up, thereby alleviating the problem of the main body portion 21 peeling off from the display panel 10.

Figure 3C:
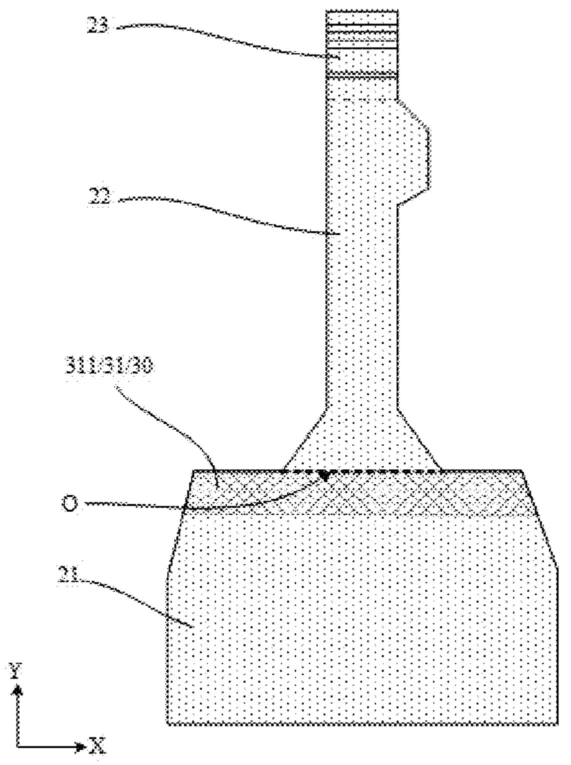
FIG. 3C is a diagram showing a connection between yet another adhesive structure and yet another flexible circuit board, in accordance with some embodiments.

FIG. 3C is a diagram showing a connection between yet another adhesive structure and yet another flexible circuit board in accordance with some embodiments.

In yet other embodiments, as shown in FIG. 3C, two ends of the first portion 311 in the first direction Y are substantially flush with two ends of the edge area of the main body portion 21 proximate to the neck portion 22 in the first direction Y.

Since when the flexible circuit board 20 is pulled up (toward a side away from the display panel), the position of the intersection line O between the main body portion 21 and the neck portion 22 of the flexible circuit board 20 is subject to great tensile stress, and the tensile stress is also relatively great at a position near the intersection line O. The tensile stress extends along a direction from the neck portion 22 pointing to the main body portion 21. With the above provision, the first portion 311 may be used to increase the adhesion between the main body portion 21 and the display panel 10 and resist partial tensile stress on a side of the main body portion 21 proximate to the neck portion 22, so as to effectively reduce the probability of the main body portion 21 being repeatedly pulled up, thereby alleviating the problem of the main body portion 21 peeling off from the display panel 10.

It will be noted that the term "substantially flush" includes absolutely flush and approximately flush. Due to certain uncontrollable errors (such as manufacturing process errors, equipment accuracy, measurement errors), if a distance between each of two ends of the first portion 311 in the first direction Y and a respective one of two ends of the edge area of the main body portion 21 proximate to the neck portion 22 in the first direction Y is within an acceptable range of deviation, it may be considered that the two ends of the main body portion 21 and the two ends of the edge area of the first portion 311 are approximately flush, respectively, and the acceptable range of deviation may be any of 30%, 20%, 10% or 5% of the distance between each of two ends of the first portion 311 in the first direction Y and the respective one of two ends of the edge area of the main body portion 21 proximate to the neck portion 22 in the first direction Y.

In some examples, when the first portion 311 is attached to the display panel 10, the adhesive structure 30 may flow to a certain extent due to the material of the adhesive structure 30.

Furthermore, the first portion 311 of the adhesive structure 30 may be provided to reserve (retract) certain distances relative to both ends of the edge area of the main body portion 21 proximate to the neck portion 22 in the first direction Y. The distances are used to compensate for the flow of the adhesive structure 30 and avoid affecting the quality of the display module 100 caused by the adhesive structure 30 overflowing to the outside of the main body portion 21.

In some examples, the distance is less than or equal to 2 mm. In a case where the distance is equal to or approaches 2 mm, sufficient space may be reserved to compensate for the flow of the adhesive structure 30 and avoid affecting the quality of the display module 100 caused by the adhesive structure 30 overflowing to the outside of the main body portion 21. Moreover, it may prevent the adhesion between the edge of the main body portion 21 and the display panel 10 from being affected caused by excessively large distances between the two ends of the first portion 311 and the two ends of the edge area of the main body portion 21.

In some other examples, the distance is less than or equal to 1 mm. In a case where the distance is equal to or approaches 1 mm, space may be reserved to compensate for the flow of the adhesive structure 30 and avoid affecting the quality of the display module 100 caused by the adhesive structure 30 overflowing to the outside of the main body portion 21. Moreover, it may well prevent the adhesion between the edge of the main body portion 21 and the display panel 10 from being affected caused by excessively large distances between the two ends of the first portion 311 and the two ends of the edge area of the main body portion 21.

In yet other examples, the distance is less than or equal to 0.5 mm. In a case where the distance is equal to or approaches 0.5 mm, the distance may not only compensate for pressure flow of the adhesive structure 30, but also prevent the adhesion between the edge of the main body portion and the display panel 10 from being affected, which is beneficial to improving the quality of the display module 100.

For example, the distance is 2 mm, 1.5 mm, 1 mm, 0.8 mm, 0.5 mm, 0.3 mm or 0.1 mm.

Figure 3D:
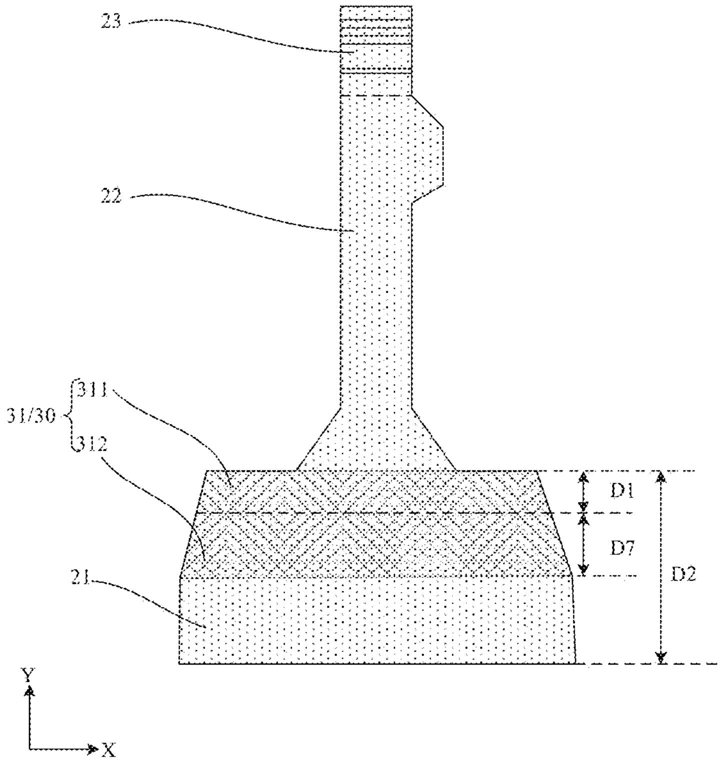
FIG. 3D is a diagram showing a connection between yet another adhesive structure and yet another flexible circuit board, in accordance with some embodiments.

FIG. 3D is a diagram showing a connection between yet another adhesive structure and yet another flexible circuit board in accordance with some embodiments.

In some embodiments, as shown in FIG. 3D, the first adhesive structure 31 further includes a second portion 312. The second portion 312 is located on a side of the first portion 311 away from the neck portion 22, and is connected to the first portion 311. A ratio of a sum of a dimension D1 of the first portion 311 in the first direction Y and a dimension D7 of the second portion 312 in the first direction Y to a dimension D2 of the main body portion 21 in the first direction Y is greater than or equal to 50% and less than or equal to 90%.

In a case where the ratio of the sum of the dimensions of the first portion 311 and the second portion 312 in the first direction Y to the dimension of the main body portion 21 in the first direction Y is equal to or approaches 50%, that is, in a case where a ratio of the dimension of the first adhesive structure 31 in the first direction Y to the dimension of the main body portion 21 in the first direction Y is equal to or approaches 50%, the waste of resources caused by an excessively large dimension of the first adhesive structure 31 may be avoided. Moreover, the demand for adhesion between the main body portion 21 and the display panel 10 may also be met, so as to prevent the main body portion 21 from peeling off from the display panel 10, thereby improving the structural stability of the display module 100 and improving the quality of the display module 100.

In a case where the ratio of the sum of the dimensions of the first portion 311 and the second portion 312 in the first direction Y to the dimension of the main body portion 21 in the first direction Y is equal to or approaches 90%, that is, in a case where a ratio of the dimension of the first adhesive structure 31 in the first direction Y to the dimension of the main body portion 21 in the first direction Y is equal to or approaches 90%, the dimension of the first adhesive structure 31 is relatively large, and the adhesion between the display panel 10 and the main body portion 21 may further be improved, so as to prevent the main body portion 21 from peeling off from the display panel 10, thereby improving the structural stability of the display module 100 and improving the quality of the display module 100. Moreover, the waste of resources caused by an excessively large dimension of the first adhesive structure 31 may also be avoided to a certain extent.

In some examples, as shown in FIG. 3D, the ratio of the sum of the dimensions of the first portion 311 and the second portion 312 in the first direction Y to the dimension of the main body portion 21 in the first direction Y is greater than or equal to 60% and less than or equal to 70%.

In a case where the ratio of the sum of the dimensions of the first portion 311 and the second portion 312 in the first direction Y to the dimension of the main body portion 21 in the first direction Y is equal to or approaches 60%, that is, in a case where a ratio of the dimension of the first adhesive structure 31 in the first direction Y to the dimension of the main body portion 21 in the first direction Y is equal to or approaches 60%, the waste of resources caused by an excessively large dimension of the first adhesive structure 31 may be avoided. Moreover, the demand for adhesion between the main body portion 21 and the display panel 10 may also be met, thereby preventing the main body portion 21 from peeling off from the display panel 10.

In a case where the ratio of the sum of the dimensions of the first portion 311 and the second portion 312 in the first direction Y to the dimension of the main body portion 21 in the first direction Y is equal to or approaches 80%, that is, in a case where a ratio of the dimension of the first adhesive structure 31 in the first direction Y to the dimension of the main body portion 21 in the first direction Y is equal to or approaches 80%, the dimension of the first adhesive structure 31 is relatively large, and the adhesion between the main body portion 21 and the display panel 10 may further be improved, thereby preventing the main body portion 21 from peeling off from the display panel 10. Moreover, the waste of resources caused by an excessively large dimension of the first adhesive structure 31 may also be avoided to a certain extent.

In some examples, the ratio of the sum of the dimensions of the first portion 311 and the second portion 312 in the first direction Y to the dimension of the main body portion 21 in the first direction Y is 50%, 60%, 70%, 80% or 90%.

Figure 3E:
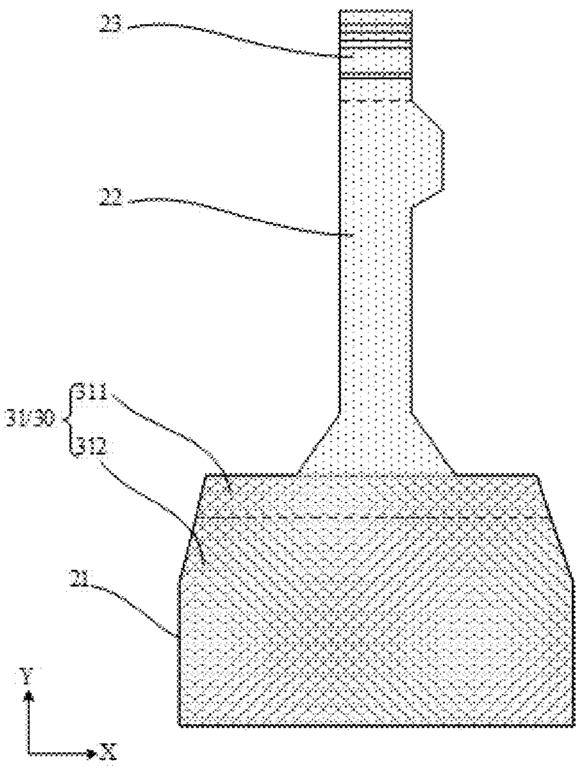
FIG. 3E is a diagram showing a connection between yet another adhesive structure and yet another flexible circuit board, in accordance with some embodiments.

FIG. 3E is a diagram showing a connection between yet another adhesive structure and yet another flexible circuit board in accordance with some embodiments.

In some embodiments, as shown in FIG. 3E, the first adhesive structure 31 further includes a second portion 312. The second portion 312 is located on a side of the first portion 311 away from the neck portion 22, and is connected to the first portion 311. A ratio of a sum of dimensions of the first portion 311 and the second portion 312 in the first direction Y to a dimension of the main body portion 21 in the first direction Y is equal to 100%.

Such setting is equivalent to that the sum of the dimensions of the first portion 311 and the second portion 312 in the first direction Y is equal to the dimension of the main body portion 21 in the first direction Y. That is, the dimension of the first adhesive structure 31 in the first direction Y is equal to the dimension of the main body portion 21 in the first direction Y. Therefore, the adhesion between the main body portion 21 and the display panel 10 may be improved well, thereby preventing the main body portion 21 from peeling off from the display panel 10. Moreover, the waste of resources caused by an excessively large dimension of the first adhesive structure 31 may also be avoided to a certain extent.

In some embodiments, as shown in FIGS. 3D and 3E, a thickness of the second portion 312 may be approximately equal to a thickness of the first portion 311.

It will be noted that the term "approximately equal" includes absolute equality and approximate equality. Due to certain uncontrollable errors (such as manufacturing process errors, equipment accuracy, measurement errors), if a difference between the thickness of the second portion 312 and the thickness of the first portion 311 is within an acceptable range of deviation, it may be considered that the thickness of the second portion 312 and the thickness of the first portion 311 are approximately equal, and the acceptable range of deviation may be any of 30%, 20%, 10% or 5% of either of the two equals.

In some embodiments, as shown in FIGS. 3D and 3E, the second portion 312 and the first portion 311 may be integrally formed, so that the second portion 312 and the first portion 311 may be formed by a a single process, which is beneficial to simplifying the process of the first adhesive structure 31.

As shown in FIGS. 3D and 3E, on a basis of the first portion 311 shown in FIG. 3C, the first adhesive structure 31 further includes a second portion 312. However, the embodiments of the present disclosure are not limited thereto. Alternatively, on a basis of the first portion 311 shown in FIG. 3A or 3B, the first adhesive structure 31 further includes a second portion 312. The provision may be made based on actual situation.

In some embodiments, as shown in FIGS. 2E and 3D, an orthographic projection of both the first portion 311 and the second portion 312 on a display surface 10*a* of the display panel 10 overlaps with an orthographic projection of the main body portion 21 on the display surface of the display panel 10.

Such provision is equivalent to an orthographic projection of the first adhesive structure 31 on the display surface of the display panel 10 overlapping with the orthographic projection of the main body portion 21 on the display surface of the display panel 10, so that the first adhesive structure 31 is provided at any position between the main body portion 21 and the display panel 10. Therefore, it may prevent the main body portion 21 from peeling off from the display panel 10 due to warping at various positions of the main body portion 21, thereby further improving the structural stability of the display module 100 and improving the quality of the display module 100.

Figure 3F:
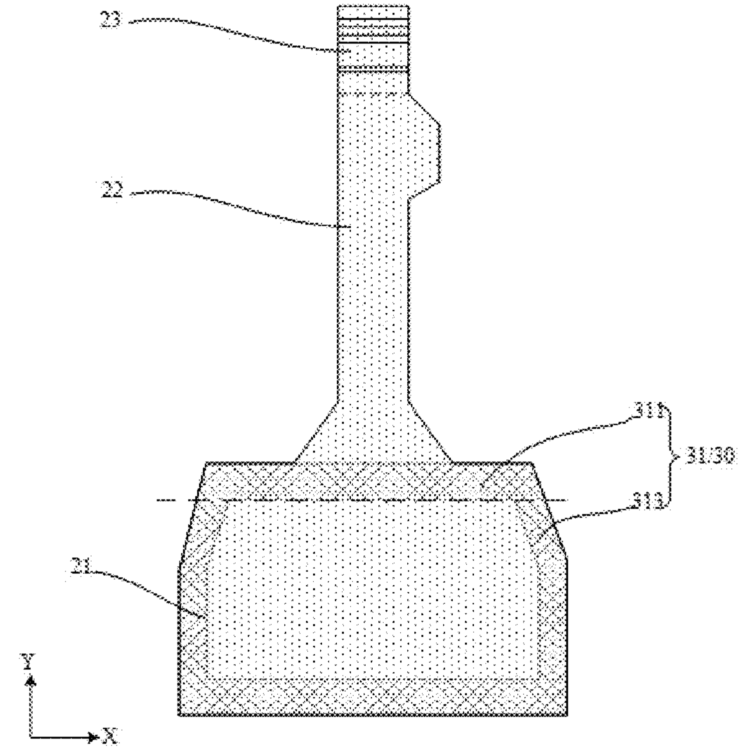
FIG. 3F is a diagram showing a connection between yet another adhesive structure and yet another flexible circuit board, in accordance with some embodiments.

FIG. 3F is a diagram showing a connection between yet another adhesive structure and yet another flexible circuit board in accordance with some embodiments.

In some embodiments, as shown in FIG. 3F, the first adhesive structure 31 further includes a third portion 313. The third portion 313 is connected to the first portion 311 to constitute a frame-shaped structure by enclosing extending along an edge of the main body portion main body portion 21. The frame-shaped structure is the first adhesive structure 31. That is, the first adhesive structure 31 provided in the embodiments extends around the edge of the main body portion 21.

Since when the flexible circuit board 20 is pulled up (toward a side away from the display panel), an edge position of the main body portion 21 of the flexible circuit board 20 is easily pulled up. Furthermore, the first adhesive structure 31 is provided to extend around the edge of the main body portion 21, thereby being conducive to the increase of the adhesion between the edge of the main body portion 21 and the display panel 10 and preventing the edge of the main body portion 21 from peeling off from the display panel 10 caused by warping due to the edge of the main body portion 21 being repeatedly pulled up. Thus, it is beneficial to improving the structural stability of the display module 100 and improving the quality of the display module 100.

Figure 3G:
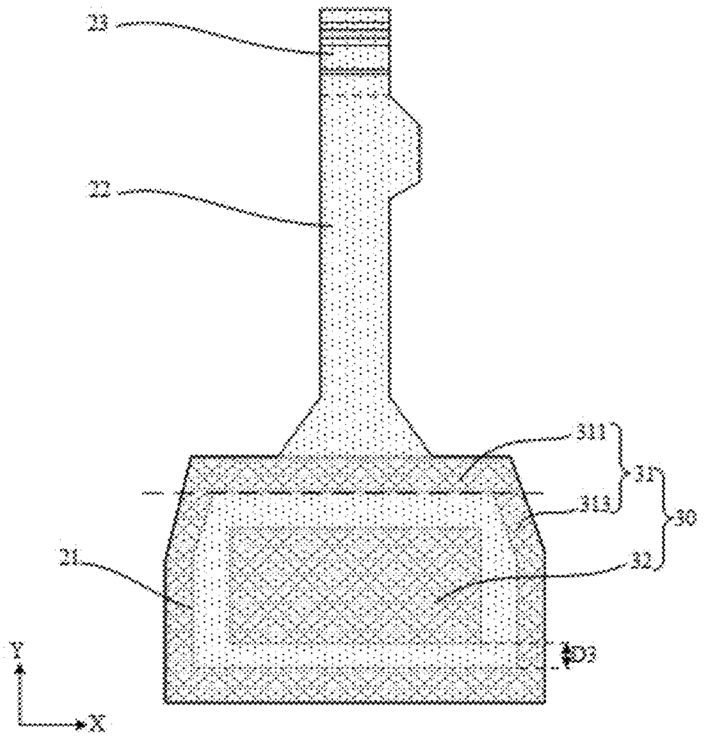
FIG. 3G is a diagram showing a connection between yet another adhesive structure and yet another flexible circuit board, in accordance with some embodiments.

FIG. 3G is a diagram showing a connection between yet another adhesive structure and yet another flexible circuit board in accordance with some embodiments.

In some embodiments, as shown in FIG. 3G, the adhesive structure 30 further includes a second adhesive structure 32. The second adhesive structure 32 is located inside the frame-shaped structure, and the second adhesive structure 32 is spaced apart from the frame-shaped structure. That is, on a basis of the first adhesive structure 31 extending around the edge of the main body portion 21, the adhesive structure 30 further includes the second adhesive structure 32, and the second adhesive structure 32 is located inside the frame-shaped structure.

The provision of the first adhesive structure 31 may increase the adhesion between the edge of the main body portion 21 and the display panel 10. The provision of the second adhesive structure 32 may increase the adhesion between the middle of the main body portion 21 and the display panel 10. Therefore, the adhesive structure 30 may increase the adhesion between the main body portion 21 and the display panel 10, thereby preventing the main body portion 21 from peeling off from the display panel 10 caused by warping due to the main body portion 21 being pulled up repeatedly. Thus, it is beneficial to improving the structural stability of the display module 100 and improving the quality of the display module 100.

In some embodiments, as shown in FIG. 3G, a thickness of the first adhesive structure 31 is set in a range of 50 μm to 200 μm, inclusive.

In a case where the thickness of the first adhesive structure 31 is equal to or approaches 50 μm, the thickness of the first adhesive structure 31 is relatively small, thereby preventing lightness and thinness of the display module 100 from being affected due to a relatively thick first adhesive structure 31. Moreover, the demand for the adhesion between the main body portion 21 and the display panel 10 may also be ensured, the problem of the main body portion 21 peeling off the display panel 10 may be prevented, and the quality of the display module 100 may be improved. In a case where the thickness of the first adhesive structure 31 is equal to or approaches 200 μm, since the adhesion of the adhesive structure 30 is proportional to the thickness thereof, the adhesion of the first adhesive structure 31 may increase while the thickness of the first adhesive structure 31 increases. That is, the main body portion 21 and the display panel 10 may be fixed well, thereby preventing the main body portion 21 from peeling off the display panel 10, and improving the quality of the display module 100. In addition, it may also prevent lightness and thinness of the display module 100 from being affected to a certain extent due to a relatively thick first adhesive structure 31.

In some other embodiments, a thickness of the first adhesive structure 31 is in a range of 80 μm to 150 μm, inclusive.

In a case where the thickness of the first adhesive structure 31 is equal to or approaches 80 μm, the thickness of the first adhesive structure 31 is relatively small, thereby preventing the first adhesive structure 31 from being too thick and ensuring the demand for the adhesion between the main body portion 21 and the display panel 10, and improving the quality of the display module 100. In a case where the thickness of the first adhesive structure 31 is equal to or approaches 150 μm, the main body portion 21 and the display panel 10 may be fixed well, and it may also prevent lightness and thinness of the display module 100 from being affected to a certain extent due to a relatively thick first adhesive structure 31.

For example, the thickness of the first adhesive structure 31 is 50 μm, 80 μm, 100 μm, 120 μm, 150 μm, 200 μm or 250 μm.

In some embodiments, as shown in FIG. 3G, a thickness of the second adhesive structure 32 is set in a range of 30 μm to 200 μm, inclusive.

In a case where the thickness of the second adhesive structure 32 is equal to or approaches 30 μm, the thickness of the second adhesive structure 32 is relatively small, thereby preventing lightness and thinness of the display module 100 from being affected due to a relatively thick second adhesive structure 32. Moreover, the demand for the adhesion between the main body portion 21 and the display panel 10 may also be ensured, the problem of the main body portion 21 peeling off the display panel 10 may be prevented, and the quality of the display module 100 may be improved. In a case where the thickness of the second adhesive structure 32 is equal to or approaches 200 μm, since the adhesion of the adhesive structure 30 is proportional to the thickness thereof, the adhesion of the second adhesive structure 32 may increase while the thickness of the second adhesive structure 32 increases. That is, the main body portion 21 and the display panel 10 may be fixed well, thereby preventing the main body portion 21 from peeling off the display panel 10, and improving the quality of the display module 100. In addition, it may also prevent lightness and thinness of the display module 100 from being affected to a certain extent due to a relatively thick second adhesive structure 32.

In some other embodiments, a thickness of the second adhesive structure 32 is in a range of 50 μm to 150 μm, inclusive.

In a case where the thickness of the second adhesive structure 32 is equal to or approaches 50 μm, the thickness of the second adhesive structure 32 is relatively small, thereby preventing the second adhesive structure 32 from being too thick and ensuring the demand for the adhesion between the main body portion 21 and the display panel 10, and improving the quality of the display module 100. In a case where the thickness of the second adhesive structure 32 is equal to or approaches 150 μm, the main body portion 21 and the display panel 10 may be fixed well, and it may also prevent lightness and thinness of the display module 100 from being affected to a certain extent due to a relatively thick second adhesive structure 32.

For example, the thickness of the second adhesive structure 32 is 30 μm, 50 μm, 80 μm, 100 μm, 120 μm, 150 μm, 200 μm or 250 μm.

In some embodiments, as shown in FIG. 3G, a thickness of the first adhesive structure 31 is greater than or equal to a thickness of the second adhesive structure.

First, the thickness of the first adhesive structure 31 is equal to the thickness of the second adhesive structure 32. Such setting may ensure the flatness of the adhesive structure 30 and simplify the process of the adhesive structure 30. Moreover, the adhesion between each position of the main body portion 21 and the display panel 10 may also be ensured, which is beneficial to improving the quality of the display module 100.

Second, the thickness of the second adhesive structure 32 is less than the thickness of the first adhesive structure 31. Since when the flexible circuit board 20 is pulled up (toward a side away from the display panel), an edge position of the main body portion 21 of the flexible circuit board 20 is easily pulled up. Furthermore, the first adhesive structure 31 is set relatively thick, thereby improving the adhesion between the edge of the main body portion 21 and the display panel 10 well and preventing the edge of the main body portion 21 from peeling off from the display panel 10 caused by warping due to the edge of the main body portion 21 being repeatedly pulled up. Thus, it is beneficial to improving the structural stability of the display module 100 and improving the quality of the display module 100.

Since the tensile stress at the middle position of the main body portion 21 is smaller than the tensile stress at the edge position thereof, warping is relatively less likely to occur at the middle position. Furthermore, the thickness of the second adhesive structure 32 may be set relatively thin. Thus, not only may the demand for the adhesion between the middle position of the main body portion 21 and the display panel 10 be met, but also it is conducive to save of resources.

In some other embodiments, as shown in FIG. 3G, on a basis of the thickness of the second adhesive structure 32 being less than the thickness of the first adhesive structure 31, a difference between the thickness of the second adhesive structure 32 and the thickness of the first adhesive structure 31 may be set less than 20 μm.

On a basis of well saving resources, it may prevent both sides of the second adhesive structure 32 from being unable to be in contact with the main body portion 21 and the display panel 10 simultaneous due to an excessively great difference in thickness between the second adhesive structure 32 and the first adhesive structure 31, that is, it may avoid the inability to improve the adhesion between the main body portion 21 and the display panel 10.

In yet other embodiments, as shown in FIG. 3G, a difference between the thickness of the second adhesive structure 32 and the thickness of the first adhesive structure 31 is less than 10 μm. On a basis of well preventing both sides of the second adhesive structure 32 from being unable to be in contact with the main body portion 21 and the display panel 10 simultaneous due to an excessively great difference in thickness between the second adhesive structure 32 and the first adhesive structure 31, that is, avoiding the inability to improve the adhesion between the main body portion 21 and the display panel 10, it may also achieve save of resources to a certain extent.

For example, the difference between the thickness of the second adhesive structure 32 and the thickness of the first adhesive structure 31 is 5 μm, 10 μm, 15 μm or 20 μm.

In some embodiments, as shown in FIG. 3G, a minimum distance D3 between the first adhesive structure 31 and the second adhesive structure 32 is greater than or equal to 2 mm.

In a case where the thickness of the first adhesive structure 31 is equal to the thickness of the second adhesive structure 32, the minimum distance D3 between the first adhesive structure 31 and the second adhesive structure 32 is set greater than or equal to 2 mm. As a result, all adhesive structure in the adhesive structure 30 have a gap therebetween, so that the amount of material used in the adhesive structure 30 is reduced, which is conducive to save of resources.

In a case where the thickness of the first adhesive structure 31 is greater than the thickness of the second adhesive structure 32, the minimum distance D3 between the first adhesive structure 31 and the second adhesive structure 32 is greater than or equal to 2 mm. As a result, sufficient space may be reserved between the first adhesive structure 31 and the second adhesive structure 32. When the main body portion 21 and the display panel 10 are attached, the first adhesive structure 31 may flow into the space to prevent the adhesion between the display panel 10 and the main body portion 21 from being affected caused by the flatness of the adhesive structure 30 being affected due to an excessively thick first adhesive structure 31.

For example, the minimum distance D3 is 2 mm, 2.5 mm or 3 mm.

In some embodiments, as shown in FIG. 3G, the adhesive structure 30 may further include a first auxiliary adhesive structure, and the first auxiliary adhesive structure may also be disposed around the second adhesive structure 32. That is, the first auxiliary adhesive structure may be located between the first adhesive structure 31 and the second adhesive structure 32.

In this case, the provision of the first auxiliary adhesive structure may further increase the adhesion between the main body portion 21 and the display panel 10, thereby preventing the structural stability of the display module 100 from being affected due to the main body portion 21 peeling off from the display panel 10.

In some examples, in a case where the thickness of the first adhesive structure 31 is equal to the thickness of the second adhesive structure 32, the thickness of the first auxiliary adhesive structure may be set equal to the thickness of the first adhesive structure 31 and the thickness of the second adhesive structure 32.

Based on this, the flatness of the adhesive structure 30 may be ensured, and the process of the adhesive structure 30 may be simplified. In addition, the adhesion between each position of the main body portion 21 and the display panel 10 may also be ensured, which is beneficial to improving the quality of the display module 100.

In some other examples, as shown in FIG. 3G, in a case where the thickness of the first adhesive structure 31 is greater than the thickness of the second adhesive structure 32, there are following cases.

First, the thickness of the first auxiliary adhesive structure may be set equal to the thickness of the first adhesive structure 31. Since the first auxiliary adhesive structure may be located between the first adhesive structure 31 and the second adhesive structure 32, that is, located outside the second adhesive structure 32, the thickness of first auxiliary adhesive structure is set equal to the thickness of the first adhesive structure 31 at the outermost edge, and thus the adhesion between the edge of the main body portion and the display panel 10 may further be improved.

Second, the thickness of the first auxiliary adhesive structure may be set equal to the thickness of the second adhesive structure 32. Since the first auxiliary adhesive structure may be located between the first adhesive structure 31 and the second adhesive structure 32, that is, the first auxiliary adhesive structure is located inside the first adhesive structure 31, the thickness of the first auxiliary adhesive structure is set equal to the thickness of the second adhesive structure 32 disposed inside, and thus the adhesion between the main body portion 21 and the display panel 10 may be improved to a certain extent, and the resources may be saved.

Third, the thickness of the first auxiliary adhesive structure may be set less than the thickness of the first adhesive structure 31 and greater than the thickness of the second adhesive structure 32. Since the first auxiliary adhesive structure may be located between the first adhesive structure 31 and the second adhesive structure 32, the thickness of the first auxiliary adhesive structure is set less than the thickness of the first adhesive structure 31 and greater than the thickness of the second adhesive structure 32, which is equivalent to that the thicknesses of the first adhesive structure 31, the first auxiliary adhesive structure and the second adhesive structure 32 decrease in sequence. Therefore, the adhesion between the main body portion 21 and the display panel 10 may be improved to a certain extent, and the resources may be saved. Moreover, the thickness gradient setting of the adhesive structure 30 may also avoid the uneven surface of the adhesive structure 30 caused by a great difference in thickness between all the adhesive structures, thereby improving the quality of the display module 100.

Figure 3H:
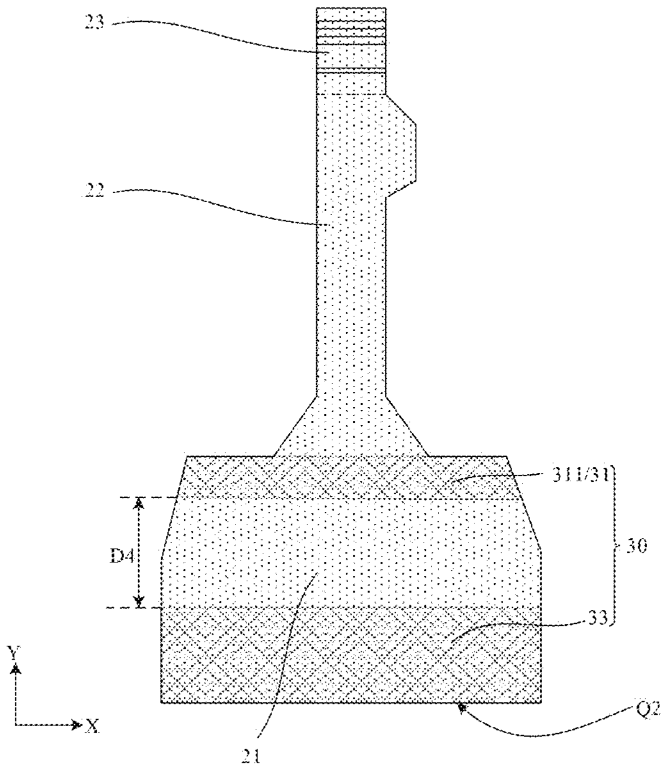
FIG. 3H is a diagram showing a connection between yet another adhesive structure and yet another flexible circuit board, in accordance with some embodiments.

FIG. 3H is a diagram showing a connection between yet another adhesive structure and yet another flexible circuit board in accordance with some embodiments.

In some embodiments, as shown in FIG. 3H, the adhesive structure 30 further includes a third adhesive structure 33. The third adhesive structure 33 is located on a side of the first portion away from the neck portion 22, and is spaced apart from the first portion.

On a basis of the adhesive structure 30 including the first adhesive structure 31, the adhesive structure 30 further includes a third adhesive structure 33, and the third adhesive structure 33 is provided on a side of the first portion away from the neck portion 22. The third adhesive structure 33 may be used to increase the adhesion between the side of the first portion away from the neck portion 22 and the display panel 10, so as to prevent the edge of the main body portion 21 from peeling off from the display panel 10 caused by warping due to being repeatedly pulled up. Thus, it is beneficial to improving the structural stability of the display module 100 and improving the quality of the display module 100.

FIG. 3H shows an example where an edge of the third adhesive structure 33 away from the first portion 311 is flush with an edge Q2 of the display panel 10. It can be understood that in some other embodiments, it may be provided that there is a gap between the edge of the third adhesive structure 33 away from the first portion 311 and the edge Q2 of the display panel 10, and the present disclosure is not limited thereto.

In some embodiments, as shown in FIG. 3H, the thickness of the first portion 311 of the first adhesive structure 31 is greater than or equal to the thickness of the third adhesive structure 33.

First, the thickness of the first portion 311 of the first adhesive structure 31 is equal to the thickness of the third adhesive structure 33. Such provision may ensure the flatness of the adhesive structure 30 and simplify the process of the adhesive structure 30. Moreover, the adhesion between each position of the main body portion 21 and the display panel 10 may also be ensured, which is beneficial to improving the quality of the display module 100.

Second, the thickness of the first portion 311 of the first adhesive structure 31 is greater than the thickness of the third adhesive structure 33.

Since when the flexible circuit board 20 is pulled up (toward a side away from the display panel), a portion of the main body portion 21 of the flexible circuit board 20 proximate to the neck portion 22 is more easily pulled up. Furthermore, the first adhesive structure 31 is set relatively thick, so that the adhesion between the portion of the main body portion 21 proximate to the neck portion 22 and the display panel 10 may be improved well, and it may prevent the main body portion 21 at this position from peeling off from the display panel 10 caused by warping due to being pulled up repeatedly. Thus, it is beneficial to improving the structural stability of the display module 100 and improving the quality of the display module 100.

Since a portion of the main body portion 21 away from the neck portion 22 is subject to a relatively small tensile stress, the problem of warping is relatively less likely to occur. Furthermore, the thickness of the third adhesive structure 33 may be set relatively thin. Thus, not only may the demand for the adhesion between the portion of the main body portion 21 away from the neck portion 22 and the display panel 10 be met, but also it is conducive to save of resources.

In some other embodiments, as shown in FIG. 3H, the thickness of the third adhesive structure 33 is less than the thickness of the first adhesive structure 31. Based on this, a difference between the thickness of the third adhesive structure 33 and the thickness of the first adhesive structure 31 may be set less than 20 μm.

On a basis of well saving resources, it may prevent both sides of the third adhesive structure 33 from being unable to be in contact with the main body portion 21 and the display panel 10 simultaneous due to an excessively great difference in thickness between the third adhesive structure 33 and the first adhesive structure 31, that is, it may avoid the inability to improve the adhesion between the main body portion 21 and the display panel 10.

In yet other embodiments, as shown in FIG. 3H, a difference between the thickness of the third adhesive structure 33 and the thickness of the first adhesive structure 31 is less than 10 μm. On a basis of well preventing both sides of the third adhesive structure 33 from being unable to be in contact with the main body portion 21 and the display panel 10 simultaneous due to an excessively great difference in thickness between the third adhesive structure 33 and the first adhesive structure 31, that is, avoiding the inability to improve the adhesion between the main body portion 21 and the display panel 10, it may also achieve save of resources to a certain extent.

For example, the difference between the thickness of the third adhesive structure 33 and the thickness of the first adhesive structure 31 is 5 μm, 10 μm, 15 μm or 20 μm.

In some embodiments, as shown in FIG. 3H, a minimum distance D4 between the first adhesive structure 31 and the third adhesive structure 33 is greater than or equal to 2 mm.

In a case where the thickness of the first adhesive structure 31 is equal to the thickness of the third adhesive structure 33, the minimum distance D4 between the first adhesive structure 31 and the third adhesive structure 33 is set greater than or equal to 2 mm. As a result, all adhesive structure in the adhesive structure 30 have a gap therebetween, so that the amount of material used in the adhesive structure 30 is reduced, which is conducive to save of resources.

In a case where the thickness of the first adhesive structure 31 is greater than the thickness of the third adhesive structure 33, the minimum distance D4 between the first adhesive structure 31 and the third adhesive structure 33 is greater than or equal to 2 mm. As a result, sufficient space may be reserved between the first adhesive structure 31 and the third adhesive structure 33. When the main body portion 21 and the display panel 10 are attached, the first adhesive structure 31 may flow into the space to prevent the adhesion between the display panel 10 and the main body portion 21 from being affected caused by the flatness of the adhesive structure 30 being affected due to an excessively thick first adhesive structure 31.

For example, the minimum distance D4 is 2 mm, 2.5 mm or 3 mm.

Figure 3I:
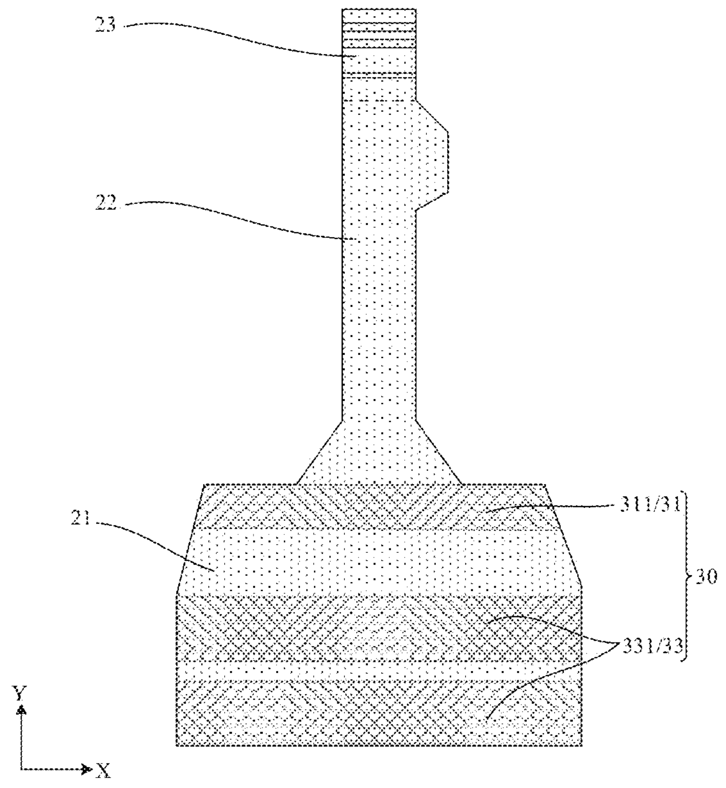
FIG. 3I is a diagram showing a connection between yet another adhesive structure and yet another flexible circuit board, in accordance with some embodiments.

FIG. 3I is a diagram showing a connection between yet another adhesive structure and yet another flexible circuit board in accordance with some embodiments.

In some embodiments, as shown in FIG. 3I, the third adhesive structure 33 includes a plurality of fourth portions 331, and the plurality of fourth portions 331 are spaced apart in the first direction Y.

The difference between FIG. 3I and FIG. 3H is that FIG. 3H is equivalent to the third adhesive structure 33 only including a single fourth portion. The third adhesive structure 33 is divided into a plurality of fourth portions 331. Such provision may not only be conducive to the increase of the adhesive area between the third adhesive structure 33 and both the main body portion 21 and the display panel 10, but also be conducive to the increase of the adhesion between the main body portion 21 and the display panel 10. The plurality of fourth portions 331 being disposed at intervals is also beneficial to save of resources.

FIG. 3H shows an example where the third adhesive structure 33 includes two fourth portions 331. However, the number of the fourth portions 331 is not limited in the embodiments of the present disclosure, and may be provided according to actual needs.

In some embodiments, as shown in FIG. 3I, the thicknesses of the fourth portions 331 are equal, and the thickness of the fourth portion 331 is equal to the thickness of the first portion 311.

Such provision may ensure the flatness of the adhesive structure 30 and simplify the process of the adhesive structure 30. Moreover, the adhesion between each position of the main body portion 21 and the display panel 10 may also be ensured, which is beneficial to improving the quality of the display module 100.

In some other embodiments, as shown in FIG. 3I, the thicknesses of the fourth portions 331 increase gradually in a direction from the main body portion 21 pointing to the neck portion 22, but the largest thickness of the fourth portion 331 does not exceed the thickness of the first portion 311 of the first adhesive structure 31. That is, in the direction from the main body portion 21 pointing to the neck portion 22, the thickness of the third adhesive structure 33 increases gradually.

Since the adhesion of the adhesive structure 30 is proportional to the thickness of the adhesive structure 30, the above structure may make the adhesion of the adhesive structure 30 gradually increased in the direction from the main body portion 21 pointing to the neck portion 22, thereby further preventing a portion of the main body portion 23 proximate to the neck portion 22 from peeling off from the display panel 10 caused by warping due to being subjected to a greater tensile stress. Moreover, the thickness gradient setting of the adhesive structure 30 may also avoid the uneven surface of the adhesive structure 30 caused by a great difference in thickness between all the adhesive structures, thereby improving the quality of the display module 100.

Figure 4A:
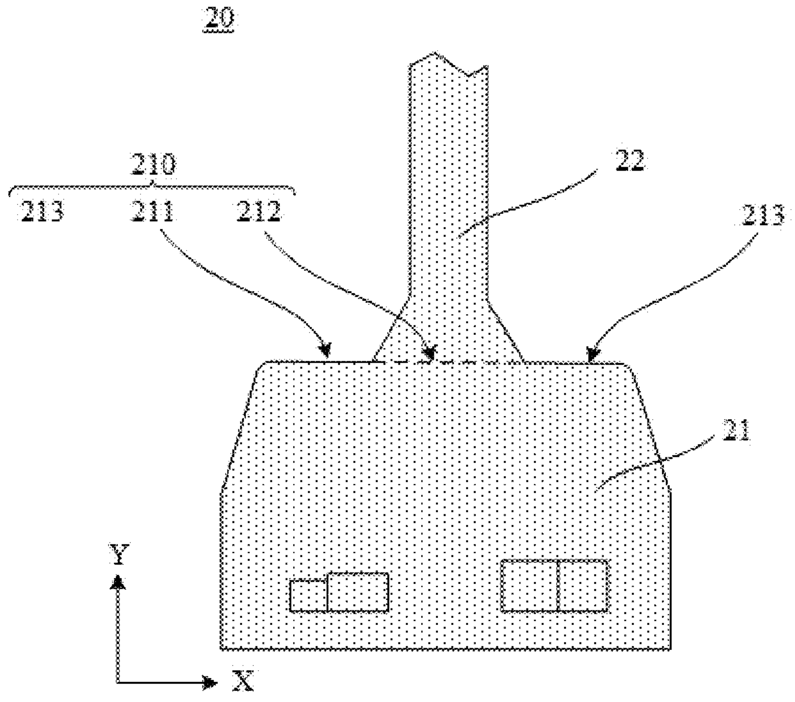
FIG. 4A is a diagram showing a connection between a main body portion and a neck portion of a flexible circuit board, in accordance with some embodiments.

FIG. 4A is a diagram showing a connection between a main body portion and a neck portion of the flexible circuit board in accordance with some embodiments.

In some embodiments, as shown in FIG. 4A, the main body portion 21 includes a first side edge 210 proximate to the neck portion 22, and the first side edge 210 includes a first line segment 211, a second line segment 212 and a third line segment 213. The second line segment 212 is connected to the neck portion 22, and the first line segment 211 and the third line segment 213 are located on both sides of the second line segment 212. An extending direction of the neck portion 22 is the first direction Y. A direction parallel to a display surface of the display panel 10 and perpendicular to the first direction Y is the second direction X. At least one of the first line segment 211 and the third line segment 213 extends in the second direction X, and has a length greater than or equal to 2 mm.

It can be understood that in some embodiments, the main body portion 21 and the neck portion 22 may be integrally formed. In this case, the second line segment 212 belongs to an intersection line between the main body portion 21 and the neck portion 22.

The at least one of the first line segment 211 and the third line segment 213 extends in the second direction X, and has a length greater than or equal to 2 mm. There are three following cases.

First, as shown in FIG. 4A, the first line segment 211 extends in the second direction X, and has a length greater than or equal to 2 mm. Limiting the length of the first line segment 211 may be conducive to increasing a width of a portion at the left of the first side edge 210 of the main body portion 21 and increasing a length of the first side edge 210 to a certain extent. Therefore, a contact area between the main body portion 21 and the display panel 10 may also increase, and on a basis of providing the adhesive structure 30, the increase of the contact area may be conducive to the increase of the adhesion between the main body portion 21 and the display panel 10, thereby preventing the main body portion 21 at this position from peeling off from the display panel 10 caused by warping due to being repeatedly pulled up. Thus, it is beneficial to improving the structural stability of the display module 100 and improving the quality of the display module 100.

Second, as shown in FIG. 4A, the third line segment 213 extends in the second direction X, and has a length greater than or equal to 2 mm. Limiting the length of the third line segment 213 may be conducive to increasing a width of a portion at the right of the first side edge 210 of the main body portion 21 and increasing a length of the first side edge 210 to a certain extent. Therefore, a contact area between the main body portion 21 and the display panel 10 may also increase, and on a basis of providing the adhesive structure 30, the increase of the contact area may be conducive to the increase of the adhesion between the main body portion 21 and the display panel 10, thereby preventing the main body portion 21 at this position from peeling off from the display panel 10 caused by warping due to being repeatedly pulled up. Thus, it is beneficial to improving the structural stability of the display module 100 and improving the quality of the display module 100.

Third, as shown in FIG. 4A, the first line segment 211 and the third line segment 213 both extend in the second direction X, and each have a length greater than or equal to 2 mm. Limiting the lengths of the first line segment 211 and the third line segment 213 may be conducive to increasing lengths of portions at both sides of the first side edge 210 of the main body portion 21, and the contact area between the main body portion 21 and the display panel 10 may also increase. On a basis of providing the adhesive structure 30, the increase of the contact area may be conducive to the increase of the adhesion between the main body portion 21 and the display panel 10, thereby preventing the main body portion 21 at the positions from peeling off from the display panel 10 caused by warping due to being repeatedly pulled up. Thus, it is beneficial to improving the structural stability of the display module 100 and improving the quality of the display module 100.

In a case where at least one of the first line segment 211 and the third line segment 213 extends in the second direction X and has a length equal to or approaches 2 mm, which is equivalent to that at least one side of the main body portion 21 expands outwardly relative to the neck portion 22, it is beneficial for the adhesive structure 30 to increasing the adhesion between the main body portion 21 and the display panel 10 and preventing the first side edge 210 from easily warping due to a relatively large tensile stress at the second line segment 212, thereby improving the quality of display module 100.

For example, at least one of the first line segment 211 and the third line segment 213 extends in the second direction X, and has a length of 2 mm, 3 mm, 4 mm, 5 mm, 6 mm, 7 mm, 8 mm, 9 mm or 10 mm.

In some embodiments, as shown in FIG. 4A, a length of the first line segment 211 is approximately equal to a length of the third line segment 213.

Setting the length of the first line segment 211 approximately equal to the length of the third line segment 213 makes the neck portion 22 connected to the middle position (the second line segment 212) of the first side edge 210 of the main body portion 21. The structure of the flexible circuit board 20 is relatively regular, which is conducive to simplifying the process difficulty of the flexible circuit board 20.

Figure 4B:
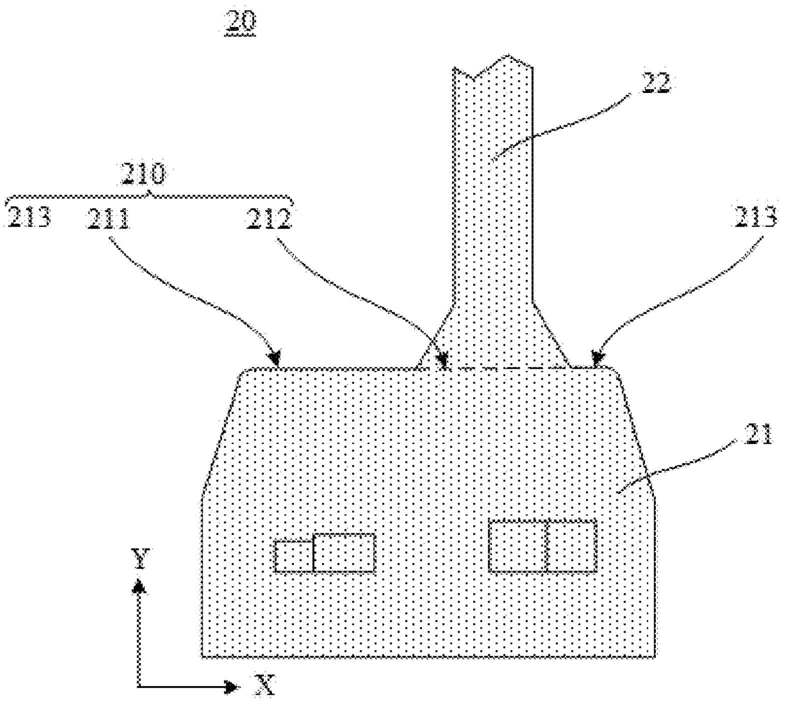
FIG. 4B is a diagram showing a connection between a main body portion and a neck portion of another flexible circuit board, in accordance with some embodiments.

FIG. 4B is a diagram showing a connection between a main body portion and a neck portion of another flexible circuit board in accordance with some embodiments.

In some other embodiments, as shown in FIG. 4B, a length of the first line segment 211 is greater than a length of the third line segment 213.

The backlight surface of the display panel 10 may be provided with some other components thereon. For example, some other components are provided on the right side of the display panel 10, that is, at the position corresponding to the third line segment 213. The length of the first line segment 211 is set greater than the length of the third line segment 213. A relatively small length of the third line segment 213 may make the neck portion 22 of the flexible circuit board 20 avoid other components, thereby preventing the quality of the display module 100 from being affected. A relatively large length of the first line segment 211 may ensure the relative area between the main body portion 21 and the display panel 10, which is beneficial for the adhesive structure 30 to increasing the adhesion between the main body portion 21 at this position and the display panel 10 and preventing the main body portion 21 from peeling off from the display panel 10, thereby improving the quality of the display module 100.

In some embodiments, as shown in FIGS. 4A and 4B, on a basis of the length of the first line segment 211 being greater than or equal to the length of the third line segment 213, the length of the first line segment 211 is greater than or equal to 8 mm.

In a case where the length of the first line segment 211 is equal to or approaches 8 mm, the demand for the contact area between the main body portion 21 and the display panel 10 may be met, so that the adhesive structure 30 is provided between the main body portion 21 and the display panel 10 to increase the adhesion between the main body portion 21 and the adhesive structure 30. Moreover, it may also prevent the layout of the flexible circuit board 20 from being affected due to an excessively long first line segment 211.

For example, the length of the first line segment 211 is equal to 8 mm, 10 mm, 12 mm or 15 mm.

Figure 4C:
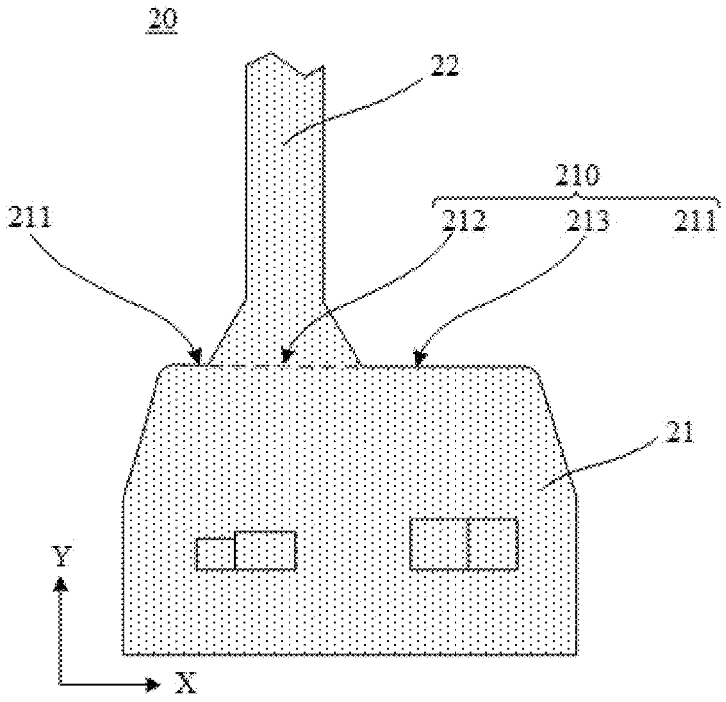
FIG. 4C is a diagram showing a connection between a main body portion and a neck portion of yet another flexible circuit board, in accordance with some embodiments.

FIG. 4C is a diagram showing a connection between a main body portion and a neck portion of yet another flexible circuit board in accordance with some embodiments.

In some other embodiments, as shown in FIG. 4C, a length of the first line segment 211 is less than a length of the third line segment 213.

The backlight surface of the display panel 10 may be provided with some other components thereon. For example, some other components are provided on the left side of the display panel 10, that is, at the position corresponding to the first line segment 211. The length of the first line segment 211 is set less than the length of the third line segment 213. A relatively small length of the first line segment 211 may make the neck portion 22 of the flexible circuit board 20 avoid other components, thereby preventing the quality of the display module 100 from being affected. A relatively large length of the third line segment 213 may ensure the relative area between the main body portion 21 and the display panel 10, which is beneficial for the adhesive structure 30 to increasing the adhesion between the main body portion 21 at this position and the display panel 10 and preventing the main body portion 21 from peeling off from the display panel 10, thereby improving the quality of the display module 100.

In some embodiments, as shown in FIGS. 4A and 4C, in a case where the length of the first line segment 211 is less than the length of the third line segment 213, the length of the third line segment 213 is greater than or equal to 8 mm.

In a case where the length of the third line segment 213 is equal to or approaches 8 mm, the demand for the contact area between the main body portion 21 and the display panel 10 may be met, so that the adhesive structure 30 is provided between the main body portion 21 and the display panel 10 to increase the adhesion between the main body portion 21 and the adhesive structure 30. Moreover, it may also prevent the layout of the flexible circuit board 20 from being affected due to an excessively long third line segment 213.

For example, the length of the third line segment 213 is equal to 8 mm, 10 mm, 12 mm or 15 mm.

Figure 4D:
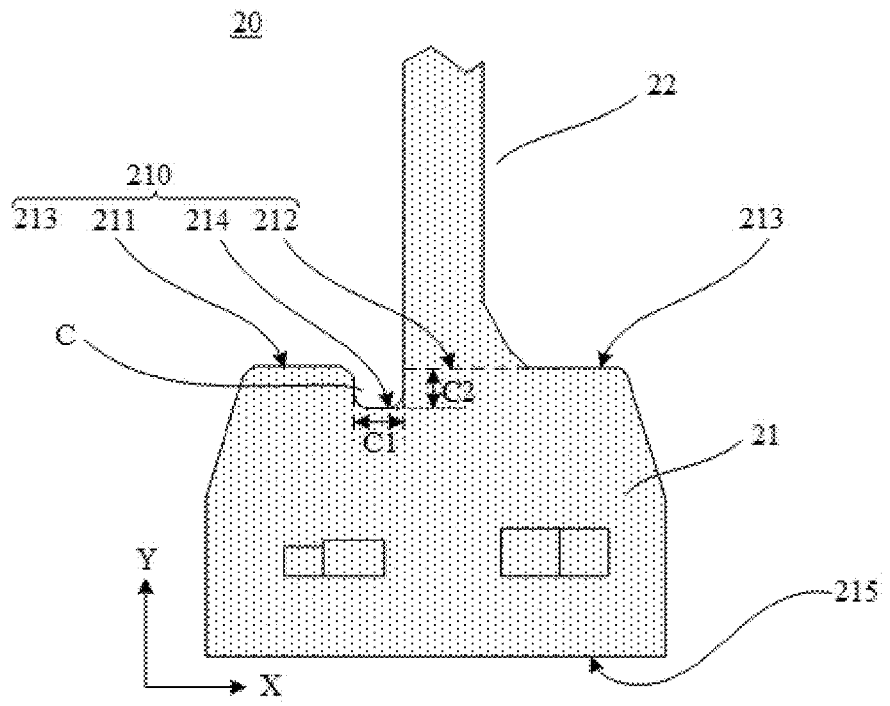
FIG. 4D is a diagram showing a connection between a main body portion and a neck portion of yet another flexible circuit board, in accordance with some embodiments.

FIG. 4D is a diagram showing a connection between a main body portion and a neck portion of yet another flexible circuit board in accordance with some embodiments.

In some other examples, as shown in FIG. 4D, the first line segment 211 and the third line segment 213 extend in the second direction X. The first side edge 210 further includes a fourth line segment 214. The fourth line segment 214 is connected between the first line segment 211 and the second line segment 212, and the middle portion of the fourth line segment 214 protrudes toward the second side edge 215. The second side edge 215 is an edge opposite to the first side edge 210 of the main body portion 21. The fourth line segment 214 defines a groove structure C, and a dimension C1 of the groove structure C in the second direction X is greater than or equal to a dimension C2 of the groove structure C in the first direction Y.

The first side edge 210 of the main body portion 21 further includes the fourth line segment 214. The middle portion of the fourth line segment 214 protrudes toward the second side edge 215 to form a groove structure C. The fourth line segment 214 is connected between the first line segment 211 and the second line segment 212. That is, the groove structure C is provided on a side of the first line segment 211 proximate to the second line segment 212.

The groove structure C at this position may be used to relieve the tensile stress to which the first line segment 211 and the second line segment 212 are subjected, thereby preventing the first line segment 211 and the second line segment 212 in the main body portion 21 from being peeling off from the display panel 10 caused by warping due to being repeatedly pulled up. Thus, it is beneficial to improving the structural stability of the display module 100 and improving the quality of the display module 100.

The dimension C1 (i.e., the width C1) of the groove structure C in the second direction X is set greater than or equal to the dimension C2 (i.e., the depth C2) of the groove structure C in the first direction Y, that is, the width C1 of the groove structure C is set greater than or equal to the depth C2 of the groove structure C. FIG. 4D shows an example where the width C1 of the groove structure C is equal to the depth C2 of the groove structure C. It can be understood that in some other embodiments, the width C1 of the groove structure C may be set greater than the depth C2 of the groove structure C.

In some embodiments, as shown in FIG. 4D, the width C1 of the groove structure C is greater than or equal to 5 mm. The width C1 of the groove structure C may be set large, which is equivalent to that the groove structure C occupies a large proportion of the first side edge 210 of the main body portion 21 in the second direction X, so that the tensile stress to which the first line segment 211 and the second line segment 212 are subjected may be well relieved.

In some embodiments, as shown in FIG. 4D, the depth C2 of the groove structure C is greater than or equal to 2 mm. The depth C2 of the groove structure C may be set small, so that the groove structure C occupies a small proportion of the main body portion 21 in the first direction Y, thereby preventing the layout of wiring and components in the main body portion 21 from being affected due to the size of the main body portion 21 being affected. Moreover, it may also avoid affecting the quality of the main body portion 21 caused by a rather great stress on the bottom of the groove structure C due to an excessively great depth C2 of the groove structure C.

In some embodiments, as shown in FIG. 4D, the cross-section of the groove structure C may be in a U shape, that is, the bottom of the groove structure C and the side wall of the groove structure C are connected by an arc face. Thus, the tensile stress on the groove structure C may be alleviated, thereby preventing the quality of the flexible circuit board 20 from being affected.

However, the specific shape of the cross-section of the groove structure C is not limited in the embodiments of the present disclosure, and the illustration is made only by an example of the U shape. It can be understood that in some other embodiments, the cross-section of the groove structure C may be in a shape of a semicircle.

In some embodiments, on a basis of proving the fourth line segment 214, the length of the first line segment 211 may be greater than or equal to the width C1 of the groove structure C. On a basis of using the groove structure C to reduce the tensile stress to which the first line segment 211 and the second line segment 212 are subjected, the first line segment 211 may satisfy the contact area between the main body portion 21 and the display panel 10, and thus the adhesive structure 30 may be used to increase the adhesion between the main body portion 21 and the display panel 10, thereby preventing the main body portion 21 from peeling off the display panel 10 and improving the quality of the display module 100. For example, the length of the first line segment 211 is greater than or equal to 5 mm.

FIG. 4D shows an example where the fourth line segment 214 is disposed between the first line segment 211 and the second line segment 212. However, the present disclosure is not limited thereto. It can be understood that in some other embodiments, the fourth line segment 214 may be disposed between the third line segment 213 and the second line segment 212. In this case, the structure of the second line segment 212 may be the same as the structure of the corresponding first line segment 211, and details are not repeated here.

Figure 4E:
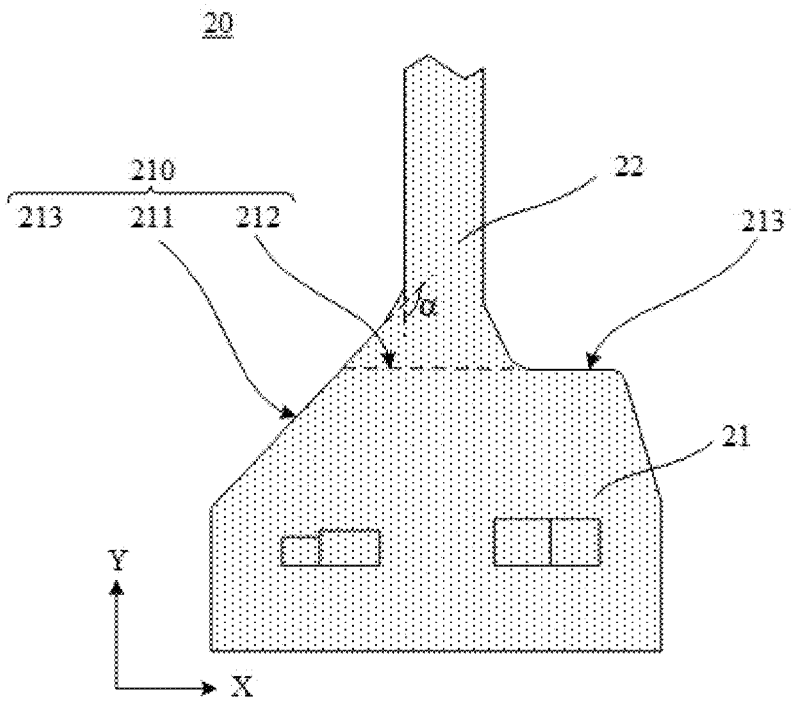
FIG. 4E is a diagram showing a connection between a main body portion and a neck portion of yet another flexible circuit board, in accordance with some embodiments.

FIG. 4E is a diagram showing a connection between a main body portion and a neck portion of yet another flexible circuit board in accordance with some embodiments.

In some other embodiments, as shown in FIG. 4E, the second line segment 212 extends in the second direction X. An included angle α between the first line segment 211 and a side edge of the neck portion 22 extending in the first direction Y is an obtuse angle.

The difference from FIGS. 4A to 4D is that the first line segment 211 and the third line segment 213 shown in FIGS. 4A to 4D are both provided in the second direction X, which may relatively simplify the process difficulty of the first side edge 210 of the flexible circuit board 20. FIG. 4E shows an example where there is an included angle between the first line segment 211 and the second direction X, that is, the first side edge 210 of the flexible circuit board 20 includes an oblique edge (the first line segment 211) and a straight edge (the second line segment 212 and the third line segment 213). With such provision, the size of the main body portion 21 of the flexible circuit board 20 may be relatively reduced, thereby well avoiding other components provided on the backlight surface of the display panel 10 and avoiding mutual short circuit or crosstalk problems.

In some examples, the included angle α is greater than 90° and less than or equal to 170° (90°≤α≤170°). In a case where the included angle α is equal to or approaches 90°, the first line segment 211 is close to a horizontal state, which may well ensure the size of the main body portion 21, so that the adhesive structure 30 may be used to well fix the main body portion 21 and the display panel 10. Moreover, some components provided on the backlight side of the display panel 10 may also be avoided to a certain extent. In a case where the included angle α is equal to or approaches 170°, the components provided on the backlight side of the display panel 10 may be well avoided. Moreover, the demand for the size of the main body portion 21 may also be met, and the adhesive structure 30 may be used to fix the main body portion 21 and the display panel 10.

In some other examples, the included angle α is greater than 120° and less than or equal to 150° (120°≤α≤150°). In a case where the included angle α is equal to or approaches 120°, the size of the main body portion 21 may be ensured, and some components provided on the backlight side of the display panel 10 may be avoided to a certain extent. In a case where the included angle α is equal to or approaches 150°, the components provided on the backlight side of the display panel 10 may be well avoided, and the demand for the size of the main body portion 21 may also be met.

For example, the included angle α is 150°, 155°, 160°, 165° or 170°.

In some embodiments, as shown in FIG. 4E, on a basis that the included angle α between the first line segment 211 and a side edge of the neck portion 22 extending in the first direction Y is an obtuse angle, a portion of the adhesive structure 30 may extend in the extension direction of the first line segment 211. Therefore, it may be beneficial to increase the adhesion between a portion of the main body portion 21 near the first line segment 211 and the display panel 10, and prevent the main body portion 21 from peeling off from the display panel 10, thereby improving the quality of the display module 100.

Figure 4F:
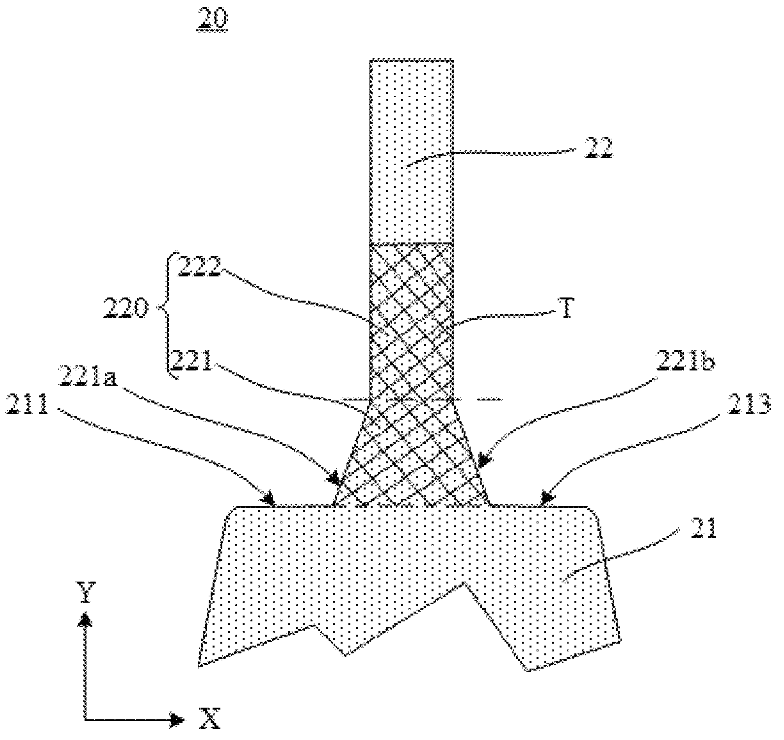
FIG. 4F is a diagram showing a connection between a main body portion and a neck portion of yet another flexible circuit board, in accordance with some embodiments.

FIG. 4F is a diagram showing a connection between a main body portion and a neck portion of yet another flexible circuit board, in accordance with some embodiment.

In some other embodiments, as shown in FIG. 4F, the neck portion 22 includes a transition portion 200 proximate to the main body portion 21. The transition portion 200 includes a mesh structure T.

That is, the mesh structure T is provided on a side of the neck portion 22 proximate to the main body portion 21, and the mesh structure may increase softness of a side of the neck portion 22 proximate to the main body portion 21. As a result, the mesh structure T may be used to reduce the tensile stress on the main body portion 21, thereby helping to prevent the main body portion 21 from peeling off from the display panel 10 and improving the quality of the display module 100.

In some embodiments, as shown in FIG. 4F, the neck portion 22 may include a flexible substrate and a wiring layer located on a side of the flexible substrate. The wiring layer includes mesh wiring, and the mesh wiring is located at the transition portion 220 to form the mesh structure T.

The specific signals transmitted by the mesh wiring are not limited in the present disclosure, and may be set according to actual situation. In some examples, the mesh wiring in the embodiments of the present disclosure may avoid using high-frequency signal wiring, so as to avoid high-frequency signal crosstalk.

In some embodiments, as shown in FIG. 4F, a ratio of a line width of a mesh line in the mesh structure T to a gap between adjacent mesh lines is in a range of 1:3 to 1:9, inclusive.

In a case where the ratio of the line width of the mesh line in the mesh structure T to the gap between adjacent mesh lines is equal to or approaches 1:3, the gap between adjacent mesh lines is relatively small, which is conducive to provision of more mesh lines. Moreover, the softness of the side of the neck portion 22 proximate to the main body portion 21 may increase. As a result, the mesh structure T may be used to reduce the tensile stress on the main body portion 21, thereby helping to prevent the main body portion 21 from peeling off from the display panel 10 and improving the quality of the display module 100.

In a case where the ratio of the line width of the mesh line in the mesh structure T to the gap between adjacent mesh lines is equal to or approaches 1:9, the gap between adjacent mesh lines are relatively large, which is conducive to a good increase of the softness of the side of the neck portion 22 proximate to the main body portion 21. As a result, the mesh structure T may be used to reduce the tensile stress on the main body portion 21, thereby helping to prevent the main body portion 21 from peeling off from the display panel 10 and improving the quality of the display module 100. Moreover, the demand for the number of mesh wiring by the display module 100 may also be met.

In some other embodiments, as shown in FIG. 4F, a ratio of a line width of a mesh line in the mesh structure T to a gap between adjacent mesh lines is in a range of 1:4 to 1:7, inclusive.

In a case where the ratio of the line width of the mesh line in the mesh structure T to the gap between adjacent mesh lines is equal to or approaches 1:4, the gap between adjacent mesh lines are small slightly, which is conducive to provision of more mesh lines. Moreover, the softness of the side of the neck portion 22 proximate to the main body portion 21 may increase.

In a case where the ratio of the line width of the mesh line in the mesh structure T to the gap between adjacent mesh lines is equal to or approaches 1:7, the gap between adjacent mesh lines is large slightly, which is conducive to a good increase of the softness of the side of the neck portion 22 proximate to the main body portion 21. Moreover, the demand for the number of mesh wiring by the display module 100 may also be met.

For example, the ratio of the line width of the mesh line in the mesh structure T to the gap between adjacent mesh lines is 1:3, 1:4, 1:5, 1:6, 1:7, 1:8 or 1:9.

In some embodiments, as shown in FIG. 4F, the transition portion 220 includes a first transition portion 221 and a second transition portion 222. The first transition portion 221 is closer to the main body portion 21 than the second transition portion 222. A width of a side of the first transition portion 221 proximate to the main body portion 21 is greater than a width of a side of the first transition portion 221 away from the main body portion 21.

The width of the neck portion 22 is generally less than the width of the main body portion 21. Therefore, the width of the side of the first transition portion 221 in contact with the main body portion 21 is set wider, so that the connection area between the first transition portion 221 and the main body portion 21 may increase, and the tensile stress received at this position may be dispersed, thereby preventing cracks or warping due to stress concentration.

In some other embodiments, as shown in FIG. 4F, the width of the first transition portion 221 gradually decreases in the first direction Y.

Setting a gradually varied width of the first transition portion 221 may disperse the tensile stress evenly, which is conducive to effectively preventing cracks or warping due to stress concentration.

In some embodiments, as shown in FIG. 4F, the first transition portion 221 includes a first side 221*a* and a second side 221*b* that are opposite in the second direction X. The first side 221*a* is connected to the first line segment 211, and the second side 221*b* is connected to the third line segment 213.

An included angle between the first side 221*a* and the first line segment 211 is an acute angle, and an included angle between the second side 221*b* and the third line segment 213 is an acute angle, so that the width of the side of the first transition portion 221 proximate to the main body portion 21 is greater than the width of the side of the first transition portion 221 away from the main body portion 21. The width of the side of the first transition portion 221 in contact with the main body portion 21 is set wider, so that the connection area between the first transition portion 221 and the main body portion 21 may increase and the tensile stress received at this position may be dispersed, thereby preventing cracks or warping due to stress concentration.

For example, the included angle between the first side 221*a* and the first line segment 211 is 45°, and the included angle between the second side 221*b* and the third line segment 213 is 45°. Thus, it may not only increase the width of the side of the first transition portion 221 in contact with the main body portion 21, but also help simplify the process difficulty.

Figure 4G:
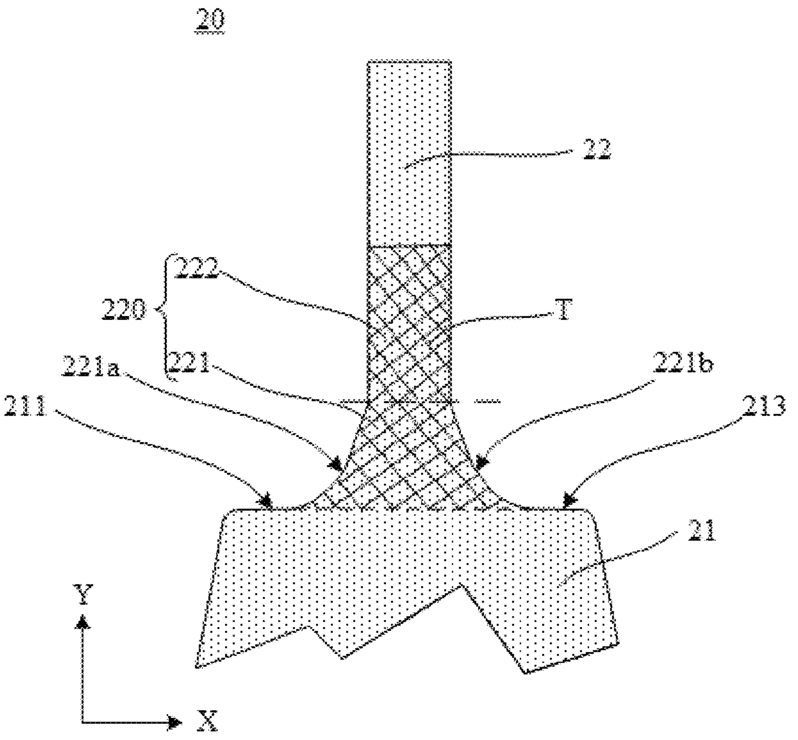
FIG. 4G is a diagram showing a connection between a main body portion and a neck portion of yet another flexible circuit board, in accordance with some embodiments.

FIG. 4G is a diagram showing a connection between a main body portion and a neck portion of yet another flexible circuit board in accordance with some embodiments.

In yet other examples, as shown in FIG. 4G, both the first side 221*a* and the second side 221*b* are arc sides. The neck portion 22 is connected to the main body portion 21 by the arc sides, alternatively, a rounded corner design may be provided for the connection position between the neck portion 22 and the main body portion 21. Further, the arc sides may be used to disperse the tensile stress at this location, thereby helping to reduce the tensile stress exerted on the main body portion 21. Thus, it may be beneficial to preventing the main body portion 21 from peeling off from the display panel 10 and improving the quality of the display module 100.

FIG. 2E is a sectional view taken along an M-M' direction in FIG. 2C.

In some embodiments, as shown in FIG. 2E, the display module 100 further includes a heat dissipation film 40. The heat dissipation film 40 is located between the display panel 10 and the flexible circuit board 20. The heat dissipation film 40 includes an adhesive layer 41, a first buffer layer 42 and a first heat dissipation layer 43. The first buffer layer 42 is located between the adhesive layer 41 and the first heat dissipation layer 43, and the adhesive layer 41 is closer to the display panel 10 than the first buffer layer 42.

With the above structure, the adhesive layer 41 at a side of the heat dissipation film 40 is connected to the display panel 10, and the first heat dissipation layer 43 at another side of the heat dissipation film 40 may be connected to the adhesive structure 30. As a result, the heat dissipation film 40 is attached to the backlight side S2 of the display panel 10, which may play a role of heat dissipation, thereby being conducive to rapid dissipation of heat generated when the display panel 10 works, and may also play a role of shading light.

Figure 5A:
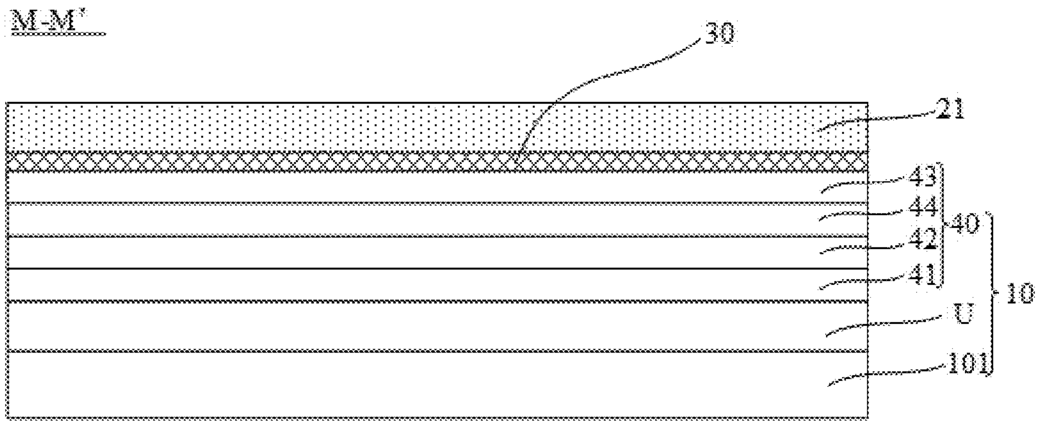
FIG. 5A is another sectional view taken along an M-M' direction in FIG. 20.

FIG. 5A is another sectional view taken along an M-M' direction in FIG. 2C.

In some other embodiments, as shown in FIG. 5A, in the heat dissipation film 40 provided in the present embodiments, at least one buffer layer includes a first buffer layer 42 and a second buffer layer 44. That is, the heat dissipation film 40 in the present embodiments may include two buffer layers. The two buffer layers may be the first buffer layer 42 and the second buffer layer 44.

Based on this, the heat dissipation film 40 includes an adhesive layer 41, the first buffer layer 42, the second buffer layer 44 and a first heat dissipation layer 43. The adhesive layer 41 is closer to the display panel 10 than the first buffer layer 42. The first buffer layer 42 is located between the adhesive layer 41 and the second buffer layer 44. An elastic modulus of the second buffer layer 44 is greater than an elastic modulus of the first buffer layer 42.

With the above structure, the adhesive layer 41 at a side of the heat dissipation film 40 is connected to the display substrate U, and the first heat dissipation layer 43 at another side of the heat dissipation film 40 may be connected to the adhesive structure 30. The first buffer layer 42 and the second buffer layer 44 are located between the adhesive layer 41 and the first heat dissipation layer 43, and the second buffer layer 44 is located between the first buffer layer 42 and the first heat dissipation layer 43. That is, the second buffer layer 44 is further away from the display substrate U than the first buffer layer 42. Based on this, the elastic modulus of the second buffer layer 44 is set greater than the elastic modulus of the first buffer layer 42, and thus the second buffer layer 44 has better elasticity and recovery performance than the first buffer layer 42. When the display module 100 is impacted by an external force, the second buffer layer 44 may be used to resist part of the stress, then the remaining part of the stress is applied to the first buffer layer 42, and the first buffer layer 42 may be used to buffer this part of the stress, so as to prevent damage to the display panel 10.

In some embodiments, the material of the second buffer layer 44 may be one or a combination of polyimide (PI), thermoplastic polyurethane elastomer (TPU), thermoplastic elastomer (TPE) or thermoplastic polyester elastomer (TPEE), which is not limited in the embodiments of the present disclosure. Alternatively, the material of the second buffer layer 44 may be from other materials with an elastic modulus greater than that of foam.

In some embodiments, a thickness of the second buffer layer 44 is in a range of 0.02 mm to 0.2 mm, inclusive. In a case where the thickness of the second buffer layer 44 is equal to or approaches 0.02 mm, it may meet the demand for buffering and recovery by the display module 100 and is conducive to achieving lightness and thinness of the display module 100, thereby avoiding waste of resources. In a case where the thickness of the second buffer layer 44 is equal to or approaches 0.2 mm, it may meet the demand for lightness and thinness of the display module 100 and achieve a good buffering and recovery effect, thereby preventing the display panel 10 from being damaged by external force.

In some other embodiments, a thickness of the second buffer layer 44 is in a range of 0.05 mm to 0.18 mm, inclusive. In some other embodiments, a thickness of the second buffer layer 44 is in a range of 0.08 mm to 0.15 mm, inclusive.

For example, the thickness of the second buffer layer 44 is 0.05 mm, 0.08 mm, 0.1 mm, 0.12 mm, 0.15 mm, 0.18 mm or 0.2 mm.

Figure 5B:
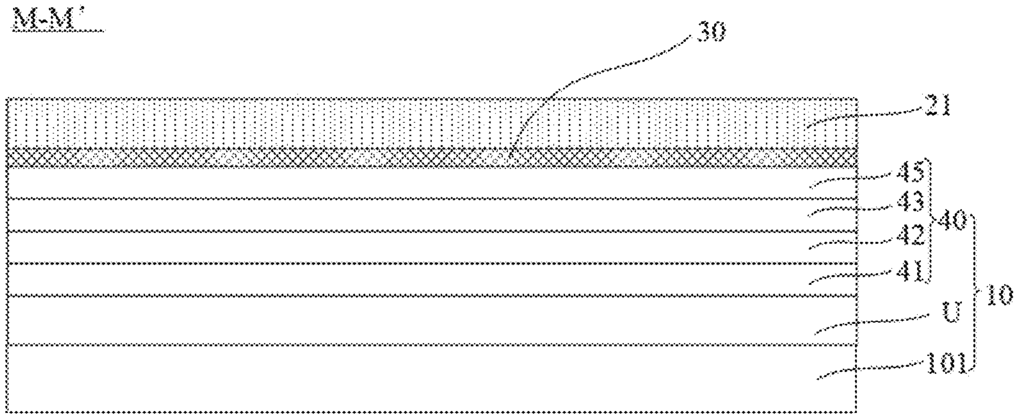
FIG. 5B is yet another sectional view taken along an M-M' direction in FIG. 20.

FIG. 5B is another sectional view taken along an M-M' direction in FIG. 2C.

In some embodiments, as shown in FIG. 5B, in the heat dissipation film 40 provided in the present embodiments, at least one heat dissipation layer includes a first heat dissipation layer 43 and a second heat dissipation layer 45. That is, the heat dissipation film 40 in the present embodiments may include two heat dissipation layers. The two heat dissipation layers are the first heat dissipation layer 43 and the second heat dissipation layer 45.

Based on this, the heat dissipation film 40 includes an adhesive layer 41, a first buffer layer 42, the first heat dissipation layer 43 and the second heat dissipation layer 45. The adhesive layer 41 is closer to the display panel 10 than the first buffer layer 42. The second heat dissipation layer 45 is located on a side of the first heat dissipation layer 43 away from the adhesive layer 41.

With the above structure, the adhesive layer 41 at a side of the heat dissipation film 40 is connected to the display substrate U, and the second heat dissipation layer 45 at another side of the heat dissipation film 40 may be connected to the adhesive structure 30. The first buffer layer 42 and the first heat dissipation layer 43 are located between the adhesive layer 41 and the second heat dissipation layer 45. The second heat dissipation layer 45 is used to dissipate heat from the display module 100, and then the first heat dissipation layer 43 is used to dissipate heat from the display module 100. That is, the first heat dissipation layer 43 and the second heat dissipation layer 45 may be jointly used to dissipate heat from the display module 100, so that the heat dissipation film 40 has a good heat dissipation effect.

In some examples, the material of the second heat dissipation layer 45 may be graphite.

Figure 5C:
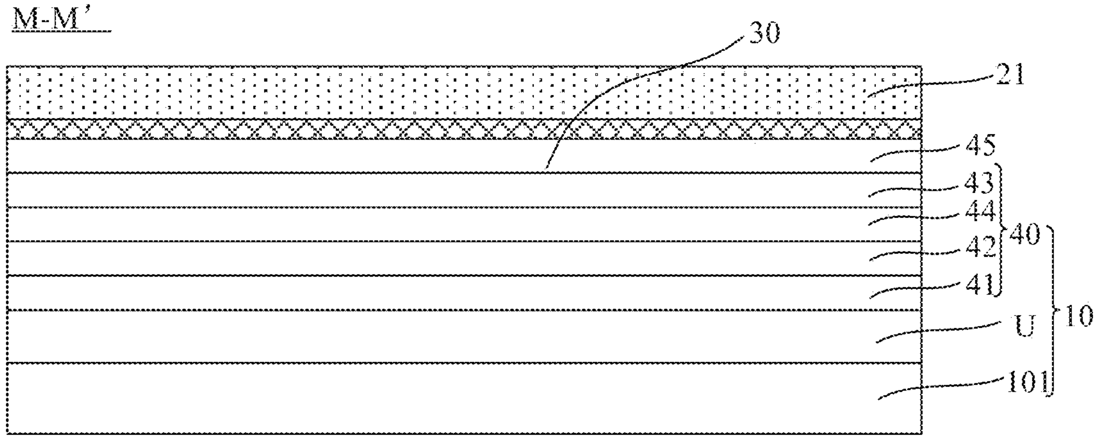
FIG. 5C is yet another sectional view taken along an M-M' direction in FIG. 20.

FIG. 5C is yet another sectional view taken along an M-M' direction in FIG. 2C.

In some embodiments, as shown in FIG. 50, in the heat dissipation film 40 provided in the present embodiments, at least one heat dissipation layer includes a first heat dissipation layer 43 and a second heat dissipation layer 45, and at least one buffer layer includes a first buffer layer 42 and a second buffer layer 44. That is, the heat dissipation film 40 in the present embodiments may include two buffer layers and two heat dissipation layers. The two buffer layers are the first buffer layer 42 and the second buffer layer 44. The two heat dissipation layers are the first heat dissipation layer 43 and the second heat dissipation layer 45.

Based on this, the heat dissipation film 40 includes an adhesive layer 41, the first buffer layer 42, the second buffer layer 44, the first heat dissipation layer 43 and the second heat dissipation layer 45. The second buffer layer 44 is located between the first buffer layer 42 and the first heat dissipation layer 43. An elastic modulus of the second buffer layer 44 is greater than an elastic modulus of the first buffer layer 42. The second heat dissipation layer 45 is located on a side of the first heat dissipation layer 43 away from the adhesive layer 41.

With the above structure, the adhesive layer 41 at a side of the heat dissipation film 40 is connected to the display substrate U, and the second heat dissipation layer 45 at another side of the heat dissipation film 40 may be connected to the adhesive structure 30. The first buffer layer 42, the second buffer layer 44 and the first heat dissipation layer 43 are located between the adhesive layer 41 and the second heat dissipation layer 45. When the display module 100 is impacted by an external force, the second buffer layer 44 may be used to resist part of the stress, then the remaining part of the stress is applied to the first buffer layer 42, and the first buffer layer 42 may be used to buffer this part of the stress, so as to prevent damage to the display panel 10 (the display substrate U). In addition, the first heat dissipation layer 43 and the second heat dissipation layer 45 may be jointly used to dissipate heat from the display module 100, so that the heat dissipation film 40 has a good heat dissipation effect.

Figure 6A:
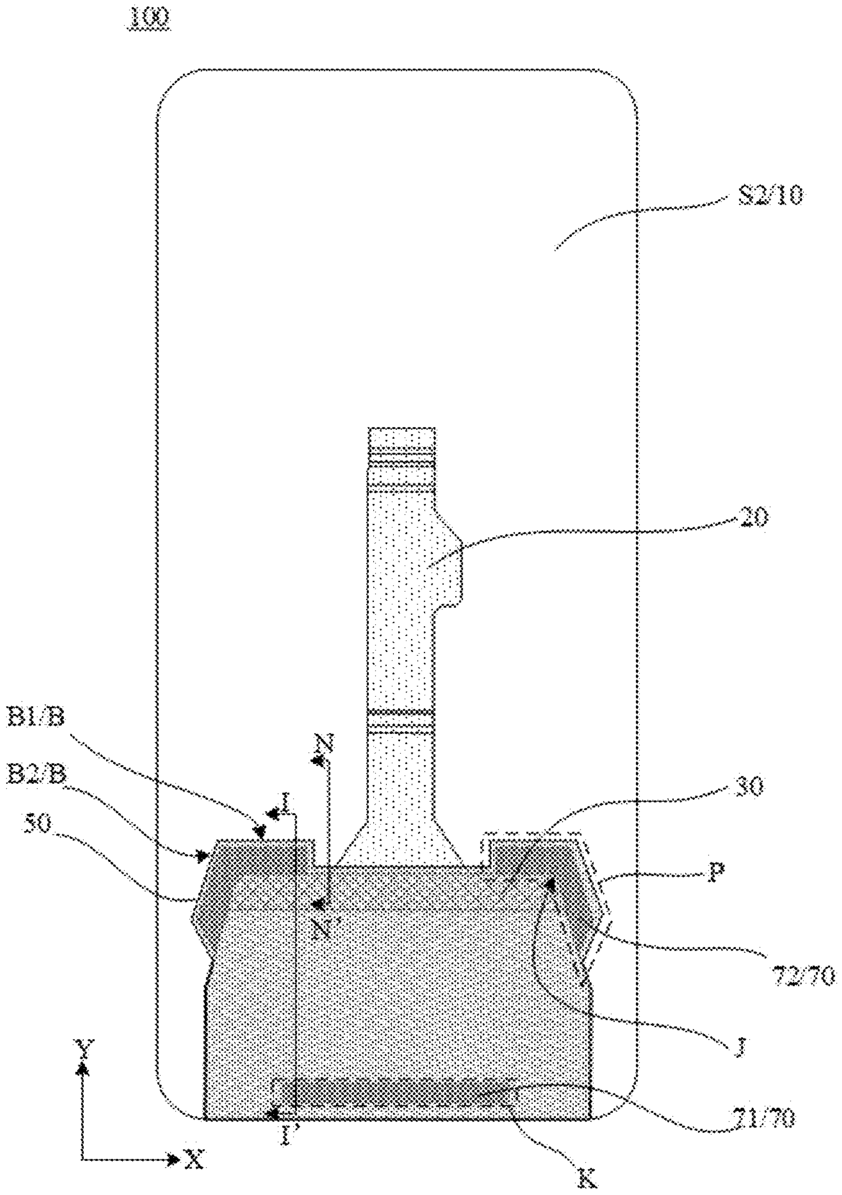
FIG. 6A is a structural diagram of a backlight side of another display module, in accordance with some embodiments.

FIG. 6A is a structural diagram of a backlight side of another display module in accordance with some embodiments.

In some embodiments, as shown in FIG. 6A, the display module 100 further includes a shielding film 50. The shielding film 50 is located on a side of the main body portion 21 away from the display panel 10. An orthographic projection of the shielding film 50 on the display surface of the display panel 10 covers an orthographic projection of the main body portion 21 on the display surface of the display panel 10. The shielding film 50 may be used to shield the electromagnetic influence from the outside and ensure the display quality of the display module 100.

In some embodiments, as shown in FIG. 6A, on a basis that the orthographic projection of the shielding film 50 on the display surface of the display panel 10 covers the orthographic projection of the main body portion 21 on the display surface of the display panel 10, at least one edge B of the orthographic projection of the shielding film 50 on the display surface of the display panel 10 is provided to be located outside the orthographic projection of the main body portion 21 on the display surface of the display panel 10.

The at least one edge B of the orthographic projection of the shielding film 50 on the display surface of the display panel 10 is provided to be located outside the orthographic projection of the main body portion 21 on the display surface of the display panel 10, that is, the shielding film 50 is provided to expand outwardly relative to the main body portion 21 to a certain extent, Therefore, it may prevent the orthographic projection of the shielding film 50 on the display surface of the display panel 10 from being unable to cover the orthographic projection of the entire main body portion 21 on the display surface of the display panel 10 due to uncontrollable errors (such as manufacturing process errors, equipment accuracy, measurement errors). Thus, the shielding film 50 may be well used to shield the electromagnetic influence from the outside and ensure the display quality of the display module 100.

In some embodiments, as shown in FIG. 6A, the orthographic projection of the shielding film 50 on the display surface of the display panel 10 includes a first edge B1 proximate to the neck portion 22. The first edge B1 is located outside the orthographic projection of the main body portion 21 on the display surface of the display panel 10.

The first edge B1 of the orthographic projection of the shielding film 50 on the display surface of the display panel 10 is provided to be located outside the orthographic projection of the main body portion 21 on the display surface of the display panel 10. That is, it may be equivalent to that a side of the shielding film 50 proximate to the neck portion 22 expands outwardly, and the orthographic projection of the shielding film 50 on the display surface of the display panel 10 may also cover part of the orthographic projection of the neck portion 22 on the display surface of the display panel 10.

Since the shielding film 50 is located on a side of the flexible circuit board 20 away from the display panel 10, and the orthographic projection of the shielding film 50 on the display surface of the display panel 10 may also cover part of the orthographic projection of the neck portion 22 on the display surface of the display panel 10. Furthermore, the shielding film 50 may be used to fix the main body portion 21, thereby preventing the main body portion 21 from easily peeling off from the display panel 10, and improving the quality of the display module 100.

In some other embodiments, as shown in FIG. 6A, the orthographic projection of the shielding film 50 on the display surface of the display panel 10 further includes a second edge B2. The second edge B2 and the first edge B1 are connected and have an obtuse angle therebetween. The second edge B2 is located outside the orthographic projection of the main body portion 21 on the display surface of the display panel 10.

In the embodiments, the second edge B2 of the shielding film 50 also expands outwardly relative to the main body portion 21, and the second edge B2 and the first edge B1 are connected and have an obtuse angle therebetween. An area P formed by the second edge B2 and the first edge B1 may be used to expand outwardly relative to an end corner J at a side of the main body portion 21 proximate to the neck portion 22.

When the flexible circuit board 20 is repeatedly pulled up, the edge of the main body portion 21 proximate to the neck portion 22 and an end of the edge are subjected to great tensile stress. With the above structure of the shielding film 50, the area P formed by the second edge B2 and the first edge B1 of the shielding film 50 may be used to fix the end corner J of the main body portion 21, thereby further preventing the main body portion 21 from easily peeling off from the display panel 10 and improving the quality of the display module 100.

In some embodiments, as shown in FIG. 6A, a minimum distance between an orthographic projection of the first edge B1 on the display surface of the display panel 10 and an orthographic projection of a corresponding edge of the main body portion 21 on the display surface of the display panel 10 is in a range of 2 mm to 15 mm, inclusive.

In a case where the minimum distance is equal to or approaches 2 mm, the shielding film 50 expands outwardly to a less extent, and may play a role of shielding the electromagnetic influence from the outside and fixing the main body portion 21, and effectively avoid waste of resources. In a case where the minimum distance is equal to or approaches 15 mm, the shielding film 50 expands outwardly to a greater extent, and may avoid waste of resources, play a role of shielding the electromagnetic influence from the outside well and fixing the main body portion 21, thereby improving the display quality of the display module 100.

In some other embodiments, a minimum distance between an orthographic projection of the first edge B1 on the display surface of the display panel 10 and an orthographic projection of a corresponding edge of the main body portion 21 on the display surface of the display panel 10 is in a range of 3.5 mm to 10 mm, inclusive. In yet other embodiments, a minimum distance between an orthographic projection of the first edge B1 on the display surface of the display panel 10 and an orthographic projection of a corresponding edge of the main body portion 21 on the display surface of the display panel 10 is in a range of 5 mm to 8 mm, inclusive.

For example, the minimum distance between the orthographic projection of the first edge B1 on the display surface of the display panel 10 and the orthographic projection of a corresponding edge of the main body portion 21 on the display surface of the display panel 10 is 2 mm, 3 mm, 4 mm, 5 mm, 6 mm, 7 mm, 8 mm, 9 mm or 10 mm.

Figure 6B:
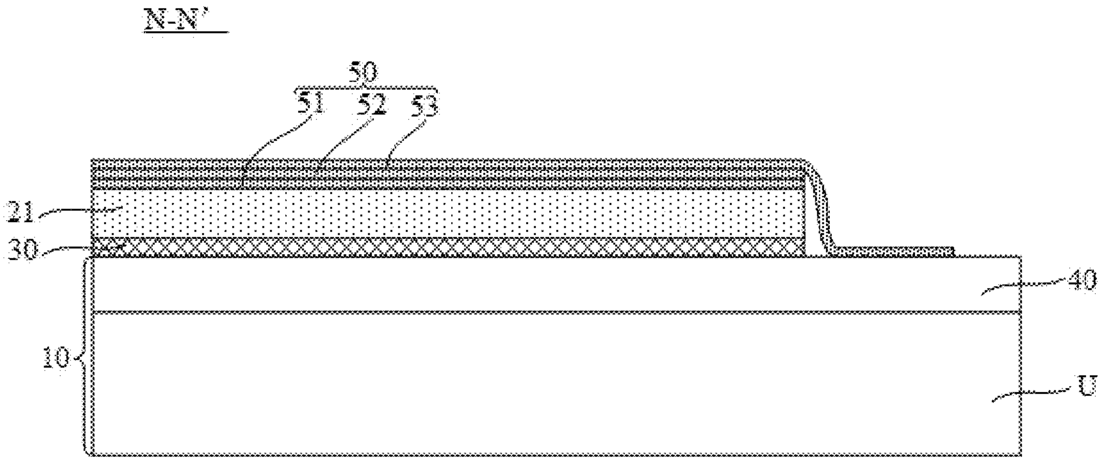
FIG. 6B is a sectional view taken along an N-N' direction in FIG. 6A.

FIG. 6B is a sectional view taken along an N-N' direction in FIG. 6A.

In some embodiments, the shielding film 50 includes a first insulating layer 51, a shielding layer 52 and a second insulating layer 53. The shielding layer 52 is located between the first insulating layer 51 and the second insulating layer 53, and the first insulating layer 51 is closer to the flexible circuit board 20 than the shielding layer 52.

The first insulating layer 51 is closer to the flexible circuit board 20 than the shielding layer 52 and may be used to insulate the flexible circuit board 20 from the shielding layer 52, so as to prevent short circuit between the flexible circuit board 20 and the shielding layer 52. Moreover, the first insulating layer 51 may also be used to be bonded to the flexible circuit board 20 and the shielding layer 52.

In some examples, the first insulating layer 51 may be an insulating adhesive layer.

In some examples, a thickness of the first insulating layer 51 is in a range of 10 μm to 100 μm, inclusive. In a case where the thickness of the first insulating layer 51 is equal to or approaches 10 μm, the shielding layer 52 and the flexible circuit board 20 may be fixedly bonded. In addition, since the thickness of the first insulating layer 51 is relatively thin, it may also be beneficial to lightness and thinness of the display module 100, and may avoid waste of resources. In a case where the thickness of the first insulating layer 51 is equal to or approaches 100 μm, it may avoid waste of resources. In addition, since the thickness of the first insulating layer 51 is relatively thick, the first insulating layer 51 has a rather stronger stickiness and may well bond the shielding layer 52 and the flexible circuit board 20.

In some other examples, a thickness of the first insulating layer 51 is in a range of 20 μm to 50 μm, inclusive.

For example, the thickness of the first insulating layer 51 is 10 μm, 20 μm, 30 μm, 40 μm, or 50 μm.

The second insulating layer 53 is located on a side of the shielding layer 52 away from the first insulating layer 51, and the second insulating layer 53 is located on the outermost side of the shielding film 50. The second insulating layer 53 may be used to protect the shielding layer 52.

In some examples, the material of the first insulating layer 51 and the material of the second insulating layer 53 may be the same and are both adhesive layers. In some other examples, the material of the first insulating layer 51 and the material of the second insulating layer 53 may be different. The embodiments of the present disclosure do not limit the materials of the first insulating layer 51 and the second insulating layer 53.

In some examples, a thickness of the second insulating layer 53 may be in a range of 20 μm to 100 μm, inclusive. In a case where the thickness of the second insulating layer 53 is equal to or approaches 20 μm, the shielding layer 52 may be fixed and protected. Moreover, since the thickness of the second insulating layer 53 is relatively thin, it may also be beneficial to lightness and thinness of the display module 100, and may avoid waste of resources. In a case where the thickness of the second insulating layer 53 is equal to or approaches 100 μm, it may avoid waste of resources. Moreover, since the thickness of the second insulating layer 53 is relatively thick, the second insulating layer 53 has a rather stronger stickiness and may well bond the shielding layer 52 and the flexible circuit board 20.

In some other examples, a thickness of the second insulating layer 53 is in a range of 30 μm to 50 μm, inclusive.

For example, the thickness of the second insulating layer 53 is 20 μm, 30 μm, 40 μm, or 50 μm.

In some embodiments, as shown in FIG. 6B, on a basis that the second insulating layer 53 is further away from the display panel 10 than the first insulating layer 51, the thickness of the second insulating layer 53 is set greater than or equal to the thickness of the first insulating layer 51.

First, as shown in FIG. 6B, the thickness of the second insulating layer 53 is equal to the thickness of the first insulating layer 51.

Setting the thicknesses of the two insulating layers in the shielding film 50 to be equal may simplify the process difficulty of the shielding film 50.

Second, the thickness of the second insulating layer 53 is greater than the thickness of the first insulating layer 51.

Setting the outer second insulating layer 53 thicker may well protect the shielding layer 52 and the display module 100. Setting the inner first insulating layer 51 thinner may save the resources of the insulating layers while bonding the flexible circuit board 20 and the shielding layer 52.

Figure 6C:
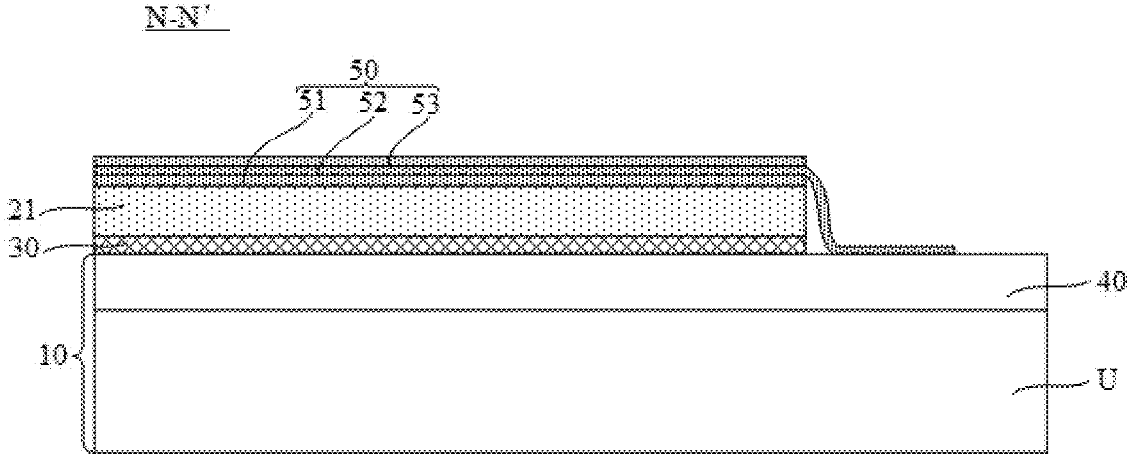
FIG. 6C is another sectional view taken along an N-N' direction in FIG. 6A.
Figure 6D:
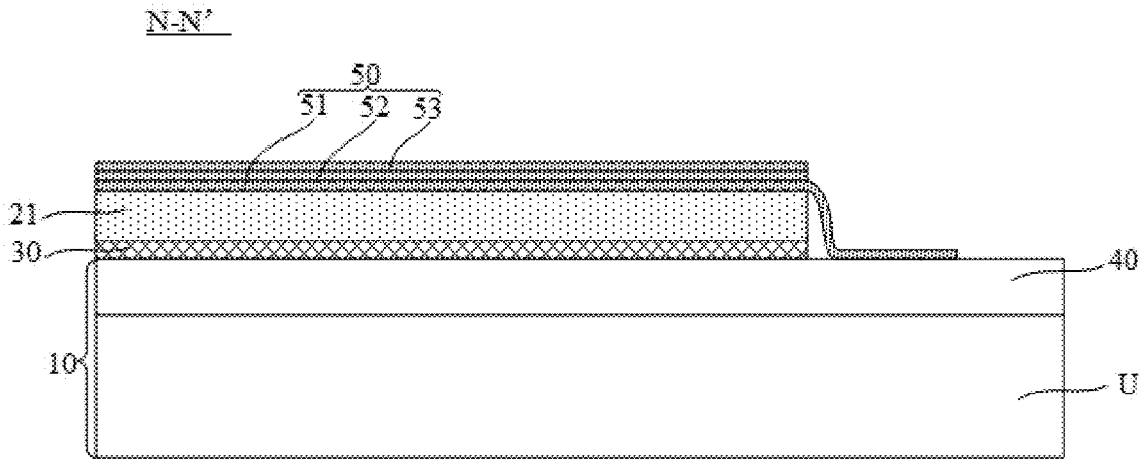
FIG. 6D is yet another sectional view taken along an N-N' direction in FIG. 6A.

FIG. 6C is another sectional view taken along an N-N' direction in FIG. 6A. FIG. 6D is yet another sectional view taken along an N-N' direction in FIG. 6A.

In some embodiments, as shown in FIGS. 6B to 6D, in a case where the shielding film 50 includes the first insulating layer 51, the shielding layer 52 and the second insulating layer 53, at least one edge of an orthographic projection of at least one of the first insulating layer 51, the shielding layer 52 and the second insulating layer 53 on the display surface of the display panel 10 is located outside the orthographic projection of the main body portion 21 on the display surface of the display panel 10. The film layer(s) expanding outwardly in the shielding film 50 may be used to fix the main body portion 21, thereby preventing the main body portion 21 from easily peeling off from the display panel 10 and improving the quality of the display module 100.

FIG. 6B shows an example of the second insulating layer 53 expanding outwardly. FIG. 6C shows an example of the shielding layer 52 expanding outwardly. FIG. 6D shows an example of the first insulating layer 51 expanding outwardly. However, the embodiments of the present disclosure do not limit to this, it may design as that any two layers in the shielding film 50 expand outwardly or all three layers expand outwardly.

Figure 6E:
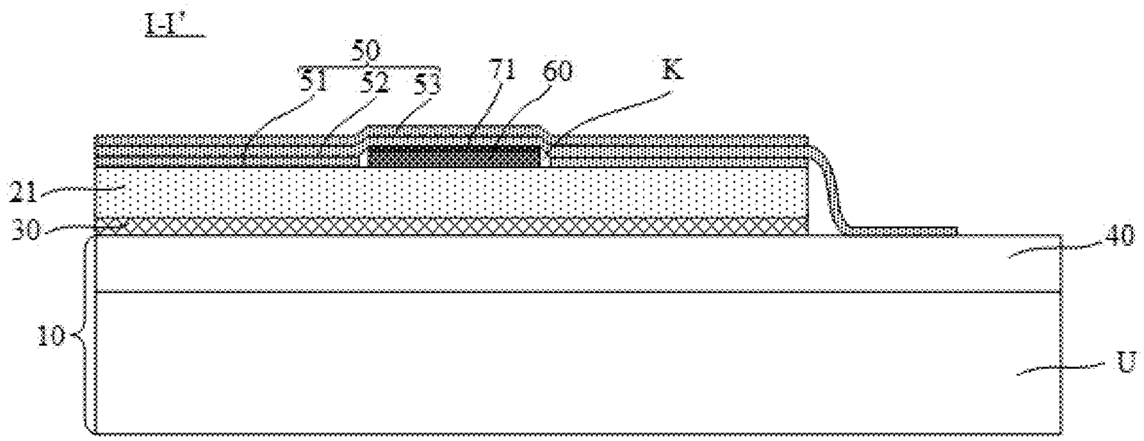
FIG. 6E is a sectional view taken along an I-I' direction in FIG. 6A.

FIG. 6E is a sectional view taken along an I-I' direction in FIG. 6A.

In some embodiments, as shown in FIGS. 6A and 6E, the display module 100 further includes a driver chip 60. The driver chip 60 is located on the backlight side S2 of the display panel 10. The driver chip 60 is used to drive the display panel 10. The first insulating layer 51 includes a first via hole K. The driver chip 60 is in contact with the shielding layer 52 through the first via hole K. In a direction parallel to the display surface of the display panel 10, a portion of the shielding layer 52 protrudes from the flexible circuit board 20 and the first insulating layer 51, so that the portion of the shielding layer 52 is in contact with the heat dissipation film 40.

With such provision, when the display module 100 works, the driver chip 60 drives the display panel 10, and the driver chip 60 will generate heat. The driver chip 60 is in contact with the shielding layer 52 through the first via hole K, and a portion of the shielding layer 52 is in contact with the heat dissipation film 40. In this case, the heat generated by the driver chip 60 will be conducted to the shielding layer 52, and the shielding layer 52 will conduct this part of the heat to the heat dissipation film 40. Therefore, the heat dissipation film 40 may be used to dissipate heat from the driver chip 60, thereby preventing the performance and life of the driver chip 60 from being affected due to excessively high heat of the driver chip 60.

FIG. 6E shows an example in which the shielding layer 52 expands outwardly and the first insulating layer 51 does not expand outwardly, so that a portion of the shielding layer 52 is in contact with the heat dissipation film 40. In this case, the second insulating layer 53 may expand outwardly. The degree of outward expansion of the second insulating layer 53 has no effect on the contact between the portion of the shielding layer 52 and the heat dissipation film 40, and may be flexibly provided. It can be understood that in a case where the first insulating layer 51 also expands outwardly and the first insulating layer 51 is provided between the shielding layer 52 and the heat dissipation film 40, the first insulating layer 51 may be provided with a second via hole therein, so that a portion of the shielding layer 52 is in contact with the heat dissipation film 40 through the second via hole.

Figure 6F:
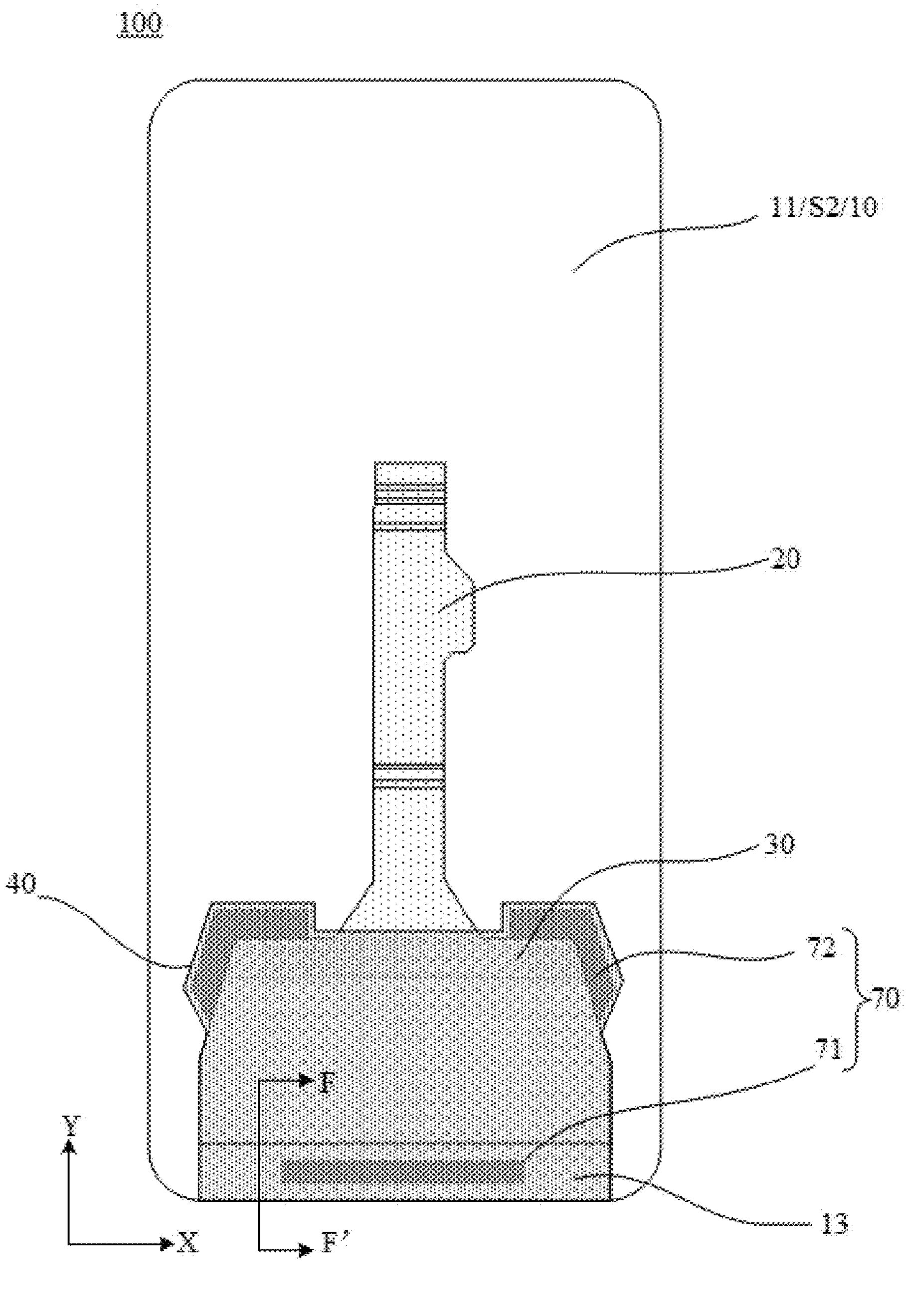
FIG. 6F is a structural diagram of a backlight side of yet another display module, in accordance with some embodiments.
Figure 6G:
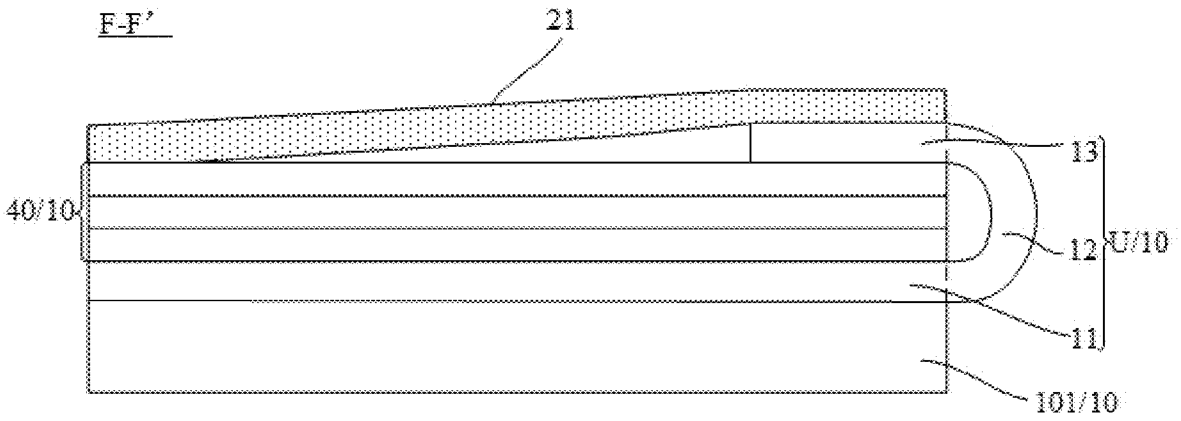
FIG. 6G is a sectional view taken along an F-F' direction in FIG. 6F.

FIG. 6F is a structural diagram of a backlight side of yet another display module in accordance with some embodiments. FIG. 6G is a sectional view taken along an F-F' direction in FIG. 6F.

For example, the description that "the display module further includes a driver chip 60 and the driver chip 60 is located on the backlight side S2 of the display panel 10" may include the following two cases.

First, as shown in FIG. 6A, the display panel 10 (the display substrate U) includes a display portion and a bonding portion. The bonding portion includes the flexible circuit board 20. The flexible circuit board 20 can be bent to the backlight side of the display panel 10.

In this case, the driver chip 60 may be bonded to the flexible circuit board 20 using a chip on film (COF) technology. Further, the driver chip 60 is disposed on an end of the main body portion 21 proximate to the neck portion 22. As a result, the driver chip 60 is bent to the backlight side of the display panel 10 along with this part of the main body portion 21. Thus, the occupation of the frame on the light exit side S1 of the display panel 10 by the driver chip 60 and the flexible circuit board 20, which is beneficial to achieving a narrow frame of the display panel 10 and increasing a screen-to-body ratio of the display module 100.

Second, as shown in FIGS. 6F and 6G, the display panel 10 is a flexible display panel. The display panel 10 (the display substrate) includes a display portion 11, a bending portion 12 and a bonding portion 13. The bending portion 12 is located between the display portion 11 and the bonding portion 13. The bonding portion 13 includes a flexible circuit board 20. The bonding portion of the display panel 10 can be bent to the backlight side S2 of the display panel 10 using the bending portion 12.

In this case, the driver chip 60 may be fixed to the bonding portion using a chip on panel (COP) technology, and the driver chip 60 is closer to the bending portion 12 than the flexible circuit board 20.

When the bonding portion is bent to the backlight side S2 of the display panel 10 using the bending portion 12, both the flexible circuit board 20 and the driver chip 60 may be bent to the backlight side of the display panel 10 along with this part of bonding portion. Thus, the occupation of the frame on the light exit side S1 of the display panel 10 by the driver chip 60 and the flexible circuit board 20 may be reduced, which is conducive to realizing a narrow frame of the display panel 10 and increasing the screen-to-body ratio of the display module 100.

It can be understood that FIG. 6E is illustrated by an example of the display module shown in FIG. 6A, but is not limited thereto. The structure shown in FIG. 6E may also be suitable for the display module 100 shown in FIG. 6F.

In some embodiments, as shown in FIGS. 6A and 6E, in a direction parallel to the display surface of the display panel 10, a minimum distance between the driver chip 60 and the first via hole K is in a range of 0.5 mm to 2 mm, inclusive. Setting the size of the first via hole K to be large may facilitate alignment and installation of the driver chip 60.

In a case where the minimum distance between the driver chip 60 and the first via hole K is equal to or approaches 0.5 mm, it may facilitate alignment and installation of the driver chip 60 and prevent short circuit between the shielding layer 52 and the flexible circuit board 20 easily caused by an excessively large first via hole K. In a case where the minimum distance between the driver chip 60 and the first via hole K is equal to or approaches 2 mm, it may prevent short circuit between the shielding layer 52 and the flexible circuit board 20 easily caused, and avoid being not conducive to alignment and installation of the driver chip 60 due to an excessively small first via hole K.

In some other embodiments, in a direction parallel to the display surface of the display panel 10, a minimum distance between the driver chip 60 and the first via hole K is in a range of 0.8 mm to 1.8 mm, inclusive. In yet other embodiments, in a direction parallel to the display surface of the display panel 10, a minimum distance between the driver chip 60 and the first via hole K is in a range of 1 mm to 1.5 mm, inclusive.

For example, in a direction parallel to the display surface of the display panel 10, a minimum distance between the driver chip 60 and the first via hole K is 0.2 mm, 0.5 mm, 0.8 mm, 1 mm, 1.2 mm, 1.5 mm, 1.8 mm or 2 mm.

In some embodiments, as shown in FIGS. 6A and 6E, the display module 100 further includes a thermally conductive structure 70. The thermally conductive structure 70 includes a first thermally conductive structure 71 and a second thermally conductive structure 72. The driver chip 60 is in contact with the shielding layer 52 by the first thermally conductive structure 71. The shielding layer 52 is in contact with the heat dissipation film 40 by the second thermally conductive structure 72.

The driver chip 60 and the shielding layer 52 are in indirect contact by the first thermally conductive structure 71, and the driver chip 60 and the shielding layer 52 are fixed, so that the heat generated by the driver chip 60 during operation may be conducted to the shielding layer 52 by the first thermally conductive structure 71.

The shielding layer 52 and the heat dissipation film 40 are in indirect contact by the second thermally conductive structure 72, and the shielding layer 52 and the heat dissipation film 40 are fixed, so that the heat conducted to the shielding layer 52 from the driver chip 60 may be conducted to the heat dissipation film 40 by the second thermally conductive structure 72. Then, the heat dissipation film 40 is used to dissipate this part of heat, thereby preventing the performance and life of the driver chip 60 from being affected due to excessively high heat of the driver chip 60.

In some examples, as shown in FIGS. 6A and 6E, the material of the first thermally conductive structure 71 and the material of the second thermally conductive structure 72 may be the same, and are both thermally conductive adhesive. It can be understood that in some other embodiments, the material of the first thermally conductive structure 71 and the material of the second thermally conductive structure 72 may be different. The present disclosure does not limit the materials, as long as the materials may play a role of bonding and thermal conduction.

Figure 7A:
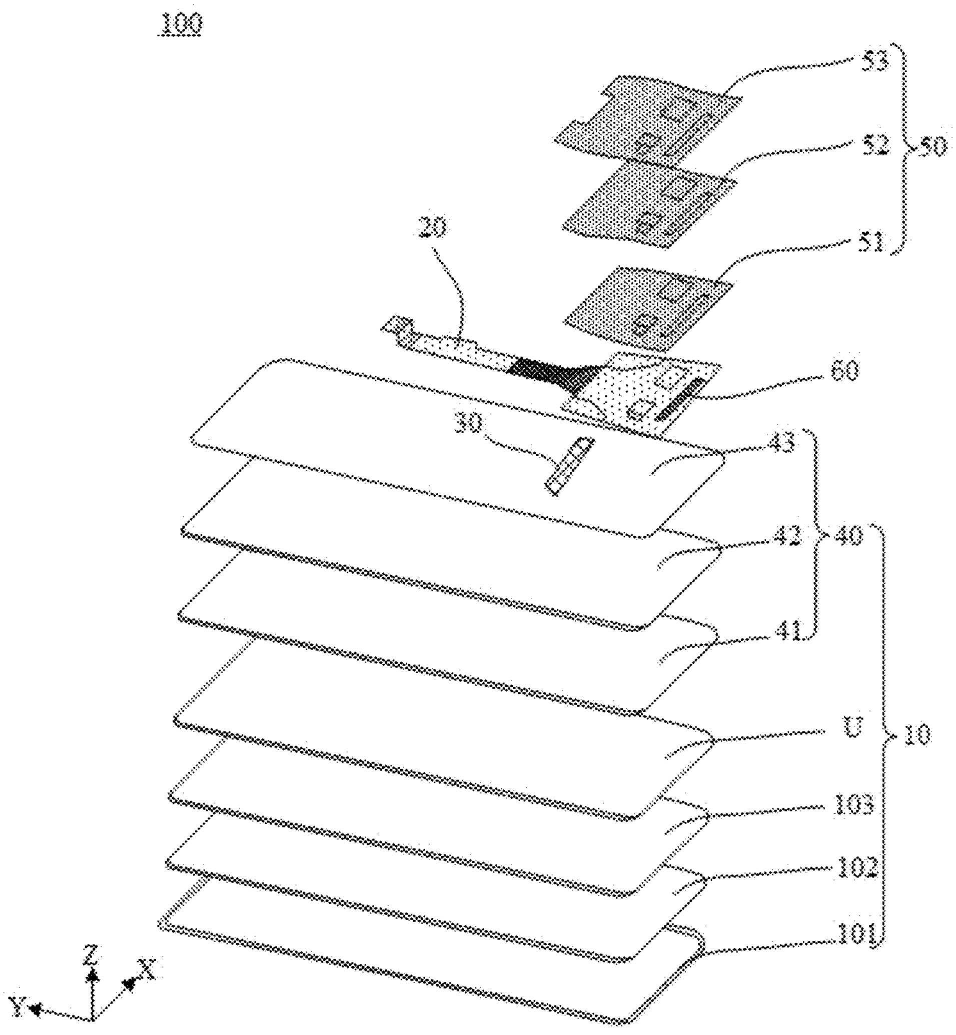
FIG. 7A is an explosive view of a display module, in accordance with some embodiments.
Figure 7B:
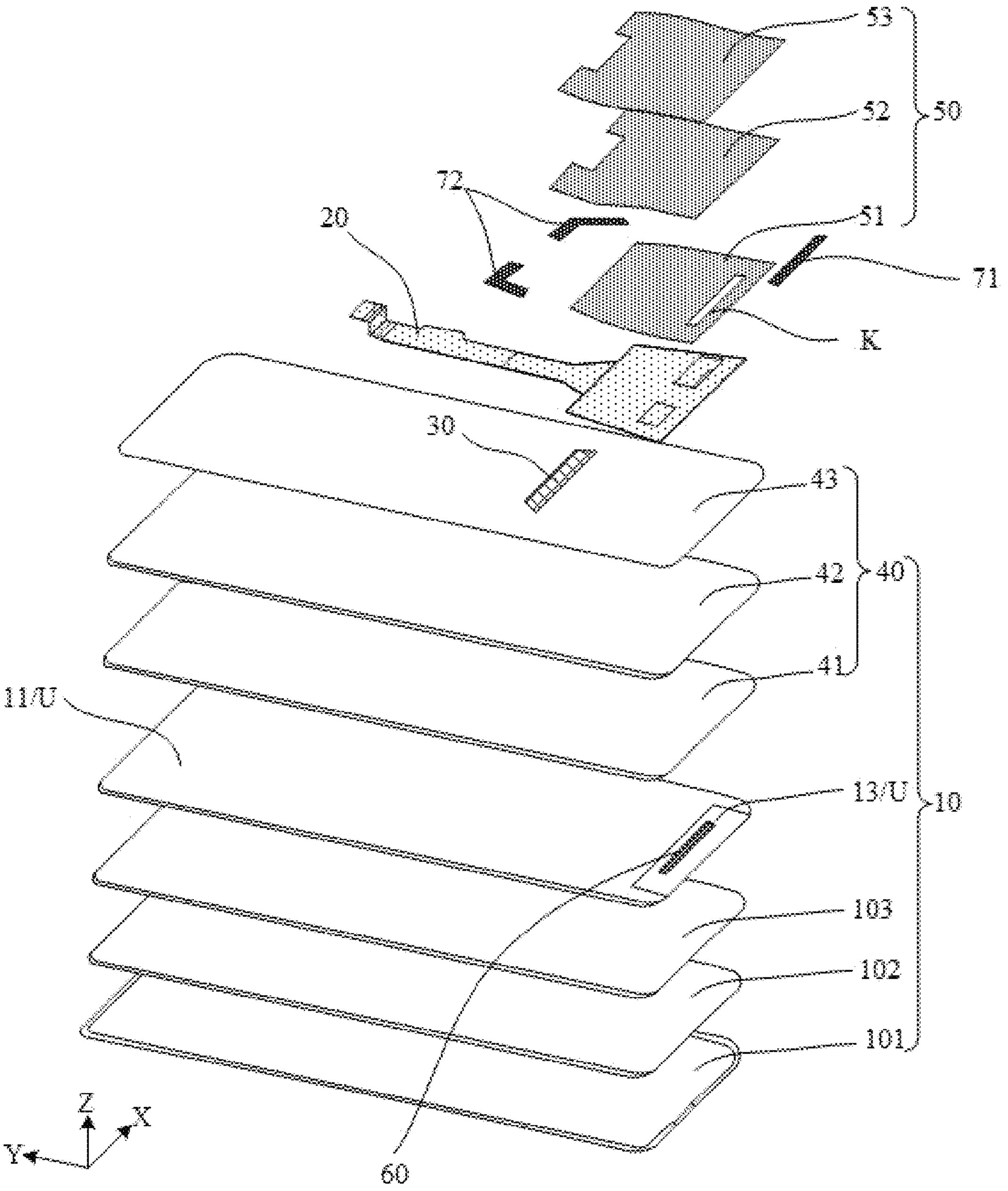
FIG. 7B is an explosive view of another display module, in accordance with some embodiments.

FIG. 7A is an explosive view of a display module in accordance with some embodiments. FIG. 7B is an explosive view of another display module in accordance with some embodiments. FIG. 7A shows an example of the display module using the COF technology. FIG. 7B shows an example of the display module using the COP technology.

In some embodiments, as shown in FIGS. 7A and 7B, the display panel 10 further includes a first optical adhesive layer 102 and a polarizer 103.

The polarizer 103 is located between the display substrate U and the protective cover plate 101. The polarizer 103 may be a circular polarizer. Here, the polarizer 103 may reduce reflection of external light and prevent the display panel 10 from producing a dazzling effect.

The first optical adhesive layer 102 is located between the protective cover plate 101 and the polarizer 103, so that the protective cover plate 101 and the polarizer 103 are fixedly bonded by the first optical adhesive layer 102. The material of the first optical adhesive layer 102 includes thermal curable resin adhesive or photo curable resin. For example, the material of the first optical adhesive layer 102 is optical clear adhesive (OCA).

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display module, comprising:

a display panel having a light exit side and a backlight side opposite to the light exit side, wherein the display panel includes a protective cover plate, a display substrate and a heat dissipation film; the display substrate is located between the protective cover plate and the heat dissipation film, and the protective cover plate is located on a side of the display substrate facing the light exit side; the heat dissipation film includes an adhesive layer, at least one buffer layer and at least one heat dissipation layer; the at least one buffer layer is located between the adhesive layer and the at least one heat dissipation layer, and the adhesive layer is located on a side of the at least one buffer layer proximate to the protective cover plate;

a flexible circuit board, wherein the flexible circuit board includes a main body portion, a neck portion and a connection portion; the neck portion is located between the main body portion and the connection portion; an end of the main body portion away from the neck portion is connected to an edge of the display panel; the connection portion, the neck portion and at least part of the main body portion are located on the backlight side of the display panel; and an adhesive structure located between the main body portion and the at least one heat dissipation layer, wherein at least part of the adhesive structure is located in an edge area of the main body portion proximate to the neck portion; wherein the adhesive structure includes a first adhesive structure;

the first adhesive structure includes a first portion; the first portion is located in the edge area of the main body portion proximate to the neck portion;

an extension direction of the neck portion is a first direction; and a ratio of a dimension of the first portion in the first direction to a dimension of the main body portion in the first direction is greater than or equal to 10% and less than or equal to 50%.

2. The display module according to claim 1, wherein a direction parallel to a display surface of the display panel and perpendicular to the first direction is a second direction; and at least one end of the first portion in the second direction extends beyond the neck portion; or a direction parallel to a display surface of the display panel and perpendicular to the first direction is a second direction; at least one end of the first portion in the second direction extends beyond the neck portion; and a dimension of the first portion in the second direction is greater than a dimension of the neck portion in the first direction.

3. The display module according to claim 1, wherein two ends of the first portion in the first direction are substantially flush with two ends of the edge area of the main body portion proximate to the neck portion in the first direction.

4. The display module according to claim 1, wherein the first adhesive structure further includes a second portion;

the second portion is located on a side of the first portion away from the neck portion, and the second portion is connected to the first portion; and a ratio of a sum of dimensions of the first portion and the second portion in the first direction to the dimension of the main body portion in the first direction is greater than or equal to 50% and less than or equal to 90%; or the ratio of the sum of the dimensions of the first portion and the second portion in the first direction to the dimension of the main body portion in the first direction is equal to 100%.

5. The display module according to claim 4, wherein an orthographic projection of both the first portion and the second portion on a display surface of the display panel overlaps with an orthographic projection of the main body portion on the display surface of the display panel.

6. The display module according to claim 1, wherein the first adhesive structure further includes a third portion; and the third portion and the first portion are connected to constitute a frame-shaped structure by enclosing extending along an edge of the main body portion.

7. The display module according to claim 6, wherein the adhesive structure further includes a second adhesive structure;

the second adhesive structure is located inside the frame-shaped structure, and the second adhesive structure and the frame-shaped structure are spaced apart.

8. The display module according to claim 1, wherein the adhesive structure further includes a third adhesive structure; and the third adhesive structure is located on a side of the first portion away from the neck portion, and the third adhesive structure and the first portion are spaced apart.

9. The display module according to claim 8, wherein the third adhesive structure includes a plurality of fourth portions, and the plurality of fourth portions are arranged at intervals in the first direction.

10. The display module according to claim 1, wherein the main body portion includes a first side edge proximate to the neck portion; the first side edge includes a first line segment, a second line segment and a third line segment; the second line segment is connected to the neck portion, and the first line segment and the third line segment are located on both sides of the second line segment;

a direction parallel to a display surface of the display panel and perpendicular to the first direction is a second direction; and at least one of the first line segment and the third line segment extends in the second direction, and has a length greater than or equal to 2 mm.

11. The display module according to claim 10, wherein the first line segment and the third line segment both extend in the second direction; the first side edge further includes a fourth line segment; the fourth line segment is connected between the first line segment and the second line segment, and a middle portion of the fourth line segment protrudes toward a second side edge; the second side edge is an edge of the main body portion opposite to the first side edge; and the fourth line segment defines a groove structure, and a dimension of the groove structure in the second direction is greater than or equal to a dimension of the groove structure in the first direction; or the second line segment extends in the second direction; and an included angle between the first line segment and a side edge of the neck portion extending in the first direction is an obtuse angle.

12. The display module according to claim 1, wherein the neck portion includes a transition portion proximate to the main body portion; and the transition portion includes a mesh structure; or the neck portion includes a transition portion proximate to the main body portion;

the transition portion includes a mesh structure; the transition portion includes a first transition portion and a second transition portion; the first transition portion is closer to the main body portion than the second transition portion; and a width of the first transition portion gradually decreases in a first direction; the first direction is an extension direction of the neck portion.

13. The display module according to claim 1, wherein the at least one buffer layer includes a first buffer layer and a second buffer layer; the first buffer layer is located between the adhesive layer and the second buffer layer; and an elastic modulus of the second buffer layer is greater than an elastic modulus of the first buffer layer; and/or the at least one heat dissipation layer includes a first heat dissipation layer and a second heat dissipation layer, and the second heat dissipation layer is located on a side of the first heat dissipation layer away from the adhesive layer.

14. The display module according to claim 1, further comprising a shielding film, wherein the shielding film is located on a side of the main body portion away from the display panel; an orthographic projection of the shielding film on a display surface of the display panel covers an orthographic projection of the main body portion on the display surface of the display panel; and at least one edge of the orthographic projection of the shielding film on the display surface of the display panel is located outside the orthographic projection of the main body portion on the display surface of the display panel.

15. The display module according to claim 14, wherein the orthographic projection of the shielding film on the display surface of the display panel includes a first edge proximate to the neck portion; and the first edge is located outside the orthographic projection of the main body portion on the display surface of the display panel; or the orthographic projection of the shielding film on the display surface of the display panel includes a first edge proximate to the neck portion and a second edge; the second edge and the first edge are connected and have an obtuse angle therebetween; the first edge is located outside the orthographic projection of the main body portion on the display surface of the display panel; and the second edge is located outside the orthographic projection of the main body portion on the display surface of the display panel.

16. The display module according to claim 14, wherein the shielding film includes a first insulating layer, a shielding layer and a second insulating layer; the shielding layer is located between the first insulating layer and the second insulating layer, and the first insulating layer is closer to the main body portion than the shielding layer; and a thickness of the second insulating layer is greater than or equal to a thickness of the first insulating layer.

17. The display module according to claim 16, further comprising a driver chip, wherein the driver chip is located on the backlight side of the display panel, and the driver chip is used to drive the display panel;

the first insulating layer includes a first via hole; the driver chip is in contact with the shielding layer through the first via hole; and in a direction parallel to the display surface of the display panel, a portion of the shielding layer protrudes from the main body portion and the first insulating layer to be in contact with the heat dissipation film.

18. The display module according to claim 17, further comprising a thermally conductive structure, wherein the thermally conductive structure includes a first thermally conductive structure and a second thermally conductive structure; the driver chip is in contact with the shielding layer through the first thermally conductive structure; and the shielding layer is in contact with the heat dissipation film through the second thermally conductive structure.

19. A display apparatus, comprising the display module according to claim 1.

20. A display module, comprising:

a display panel having a light exit side and a backlight side opposite to the light exit side, wherein the display panel includes a protective cover plate, a display substrate and a heat dissipation film; the display substrate is located between the protective cover plate and the heat dissipation film, and the protective cover plate is located on a side of the display substrate facing the light exit side; the heat dissipation film includes an adhesive layer, at least one buffer layer and at least one heat dissipation layer; the at least one buffer layer is located between the adhesive layer and the at least one heat dissipation layer, and the adhesive layer is located on a side of the at least one buffer layer proximate to the protective cover plate;

a flexible circuit board, wherein the flexible circuit board includes a main body portion, a neck portion and a connection portion; the neck portion is located between the main body portion and the connection portion; an end of the main body portion away from the neck portion is connected to an edge of the display panel; the connection portion, the neck portion and at least part of the main body portion are located on the backlight side of the display panel; and an adhesive structure located between the main body portion and the at least one heat dissipation layer, wherein at least part of the adhesive structure is located in an edge area of the main body portion proximate to the neck portion; wherein the neck portion includes a transition portion proximate to the main body portion; and the transition portion includes a mesh structure; and a ratio of a line width of a mesh line in the mesh structure to a gap between adjacent mesh lines is in a range of 1:3 to 1:9, inclusive.

* * * * *